United States Patent
Keller et al.

(10) Patent No.: US 7,566,580 B2
(45) Date of Patent: Jul. 28, 2009

(54) METHOD FOR HETEROEPITAXIAL GROWTH OF HIGH-QUALITY N-FACE GAN, INN, AND AIN AND THEIR ALLOYS BY METAL ORGANIC CHEMICAL VAPOR DEPOSITION

(75) Inventors: Stacia Keller, Santa Barbara, CA (US); Umesh Kumar Mishra, Montecito, CA (US); Nicholas A. Fichtenbaum, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/855,591

(22) Filed: Sep. 14, 2007

(65) Prior Publication Data

US 2008/0113496 A1  May 15, 2008

Related U.S. Application Data

(60) Provisional application No. 60/866,035, filed on Nov. 15, 2006.

(51) Int. Cl.
*H01L 21/20* (2006.01)
(52) U.S. Cl. .......................... 438/46; 438/483
(58) Field of Classification Search ............ 438/41, 438/44, 46, 478–509
See application file for complete search history.

(56) References Cited

U.S. PATENT DOCUMENTS

| | | | |
|---|---|---|---|
| 4,855,249 A | 8/1989 | Akasaki et al. |
| 5,741,724 A | 4/1998 | Ramdani et al. |
| 5,923,950 A | 7/1999 | Ishibashi et al. |
| 5,926,726 A | 7/1999 | Bour et al. |
| 6,045,626 A | 4/2000 | Yano et al. |
| 6,051,849 A | 4/2000 | Davis et al. |
| 6,064,078 A | 5/2000 | Northrup et al. |
| 6,064,082 A | 5/2000 | Kawai et al. |
| 6,069,021 A | 5/2000 | Terashima et al. |
| 6,072,197 A | 6/2000 | Horino et al. |
| 6,133,593 A | 10/2000 | Boos et al. |

(Continued)

FOREIGN PATENT DOCUMENTS

EP          0942459          9/1999

(Continued)

OTHER PUBLICATIONS

Di Felice, R. et al., "Energetics of AlN thin films on the Al2O3 (0001) surface," Appl. Phys. Lett., 1998, pp. 936-938, vol. 73, No. 7.

(Continued)

*Primary Examiner*—Savitri Mulpuri
(74) *Attorney, Agent, or Firm*—Gates & Cooper LLP

(57) ABSTRACT

Methods for the heteroepitaxial growth of smooth, high quality films of N-face GaN film grown by MOCVD are disclosed. Use of a misoriented substrate and possibly nitridizing the substrate allow for the growth of smooth N-face GaN and other Group III nitride films as disclosed herein. The present invention also avoids the typical large (μm sized) hexagonal features which make N-face GaN material unacceptable for device applications. The present invention allows for the growth of smooth, high quality films which makes the development of N-face devices possible.

20 Claims, 14 Drawing Sheets

U.S. PATENT DOCUMENTS

| | | | |
|---|---|---|---|
| 6,153,010 A | 11/2000 | Kiyoku et al. | |
| 6,156,581 A | 12/2000 | Vaudo et al. | |
| 6,177,057 B1 | 1/2001 | Purdy | |
| 6,177,292 B1 | 1/2001 | Hong et al. | |
| 6,180,270 B1 | 1/2001 | Cole et al. | |
| 6,201,262 B1 | 3/2001 | Edmond et al. | |
| 6,227,665 B1 | 5/2001 | Ma et al. | |
| 6,229,151 B1 | 5/2001 | Takeuchi | |
| 6,268,621 B1 | 7/2001 | Emmi et al. | |
| 6,316,785 B1 | 11/2001 | Nunoue et al. | |
| 6,350,666 B2 | 2/2002 | Kryliouk | |
| 6,391,748 B1* | 5/2002 | Temkin et al. | 438/478 |
| 6,413,627 B1 | 7/2002 | Motoki et al. | |
| 6,440,823 B1 | 8/2002 | Vaudo et al. | |
| 6,441,391 B1 | 8/2002 | Ohno et al. | |
| 6,441,403 B1 | 8/2002 | Chang et al. | |
| 6,468,882 B2 | 10/2002 | Motoki et al. | |
| 6,569,704 B1 | 5/2003 | Takeuchi et al. | |
| 6,582,986 B2 | 6/2003 | Kong et al. | |
| 6,586,316 B2 | 7/2003 | Tsuda et al. | |
| 6,599,362 B2 | 7/2003 | Ashby et al. | |
| 6,602,763 B2 | 8/2003 | Davis et al. | |
| 6,617,182 B2* | 9/2003 | Ishida et al. | 438/22 |
| 6,623,560 B2 | 9/2003 | Biwa et al. | |
| 6,624,452 B2* | 9/2003 | Yu et al. | 257/194 |
| 6,635,901 B2 | 10/2003 | Sawaki et al. | |
| 6,645,295 B1 | 11/2003 | Koike et al. | |
| 6,847,057 B1 | 1/2005 | Gardner et al. | |
| 6,849,472 B2 | 2/2005 | Krames et al. | |
| 6,849,882 B2 | 2/2005 | Chavarkar et al. | |
| 6,878,593 B2 | 4/2005 | Khan et al. | |
| 6,878,975 B2 | 4/2005 | Hueschen | |
| 6,900,070 B2 | 5/2005 | Craven et al. | |
| 6,958,494 B2 | 10/2005 | Lin et al. | |
| 7,064,357 B2* | 6/2006 | Ueta et al. | 257/103 |
| 7,067,340 B1 | 6/2006 | Tsai et al. | |
| 7,091,514 B2 | 8/2006 | Craven et al. | |
| 7,186,302 B2* | 3/2007 | Chakraborty et al. | 148/33 |
| 7,208,393 B2* | 4/2007 | Haskell et al. | 438/481 |
| 7,220,324 B2 | 5/2007 | Baker et al. | |
| 2001/0015437 A1 | 8/2001 | Ishii et al. | |
| 2001/0020700 A1 | 9/2001 | Inoue et al. | |
| 2001/0029086 A1 | 10/2001 | Ogawa et al. | |
| 2001/0042503 A1 | 11/2001 | Lo et al. | |
| 2002/0047113 A1 | 4/2002 | Ohno et al. | |
| 2002/0074552 A1 | 6/2002 | Weeks et al. | |
| 2002/0098641 A1 | 7/2002 | Tsuda et al. | |
| 2002/0144645 A1 | 10/2002 | Kim et al. | |
| 2002/0187356 A1 | 12/2002 | Weeks et al. | |
| 2003/0006407 A1 | 1/2003 | Taylor | |
| 2003/0024475 A1 | 2/2003 | Anderson | |
| 2003/0114017 A1 | 6/2003 | Wong et al. | |
| 2003/0198837 A1 | 10/2003 | Craven et al. | |
| 2004/0012032 A1 | 1/2004 | Toda et al. | |
| 2004/0094773 A1 | 5/2004 | Kiyoku et al. | |
| 2004/0108513 A1 | 6/2004 | Narukawa et al. | |
| 2004/0251471 A1 | 12/2004 | Dwilinski et al. | |
| 2004/0261692 A1 | 12/2004 | Dwilinski et al. | |
| 2005/0142391 A1 | 6/2005 | Dmitriev et al. | |
| 2005/0161697 A1 | 7/2005 | Nakahata et al. | |
| 2005/0205884 A1 | 9/2005 | Kim et al. | |
| 2005/0214992 A1 | 9/2005 | Chakraborty et al. | |
| 2005/0253222 A1* | 11/2005 | Caneau et al. | 257/607 |
| 2005/0258451 A1 | 11/2005 | Saxler et al. | |
| 2006/0006414 A1 | 1/2006 | Germain et al. | |
| 2006/0008941 A1 | 1/2006 | Haskell et al. | |
| 2006/0073621 A1 | 4/2006 | Kneissel et al. | |
| 2006/0118799 A1 | 6/2006 | D'Evelyn et al. | |
| 2006/0138431 A1 | 6/2006 | Dwilinski et al. | |
| 2006/0202105 A1 | 9/2006 | Krames et al. | |
| 2006/0202215 A1 | 9/2006 | Wierer Jr. et al. | |
| 2006/0214188 A1 | 9/2006 | Kawasaki et al. | |
| 2006/0255364 A1 | 11/2006 | Saxler et al. | |
| 2006/0270076 A1 | 11/2006 | Imer et al. | |
| 2006/0280668 A1 | 12/2006 | Dmitriev et al. | |
| 2007/0001186 A1 | 1/2007 | Murai et al. | |
| 2007/0015345 A1 | 1/2007 | Baker et al. | |
| 2007/0093073 A1 | 4/2007 | Farrell et al. | |
| 2007/0131967 A1* | 6/2007 | Kawaguchi et al. | 257/190 |
| 2007/0190758 A1* | 8/2007 | Kaeding et al. | 438/510 |
| 2007/0218703 A1* | 9/2007 | Kaeding et al. | 438/775 |
| 2008/0001165 A1* | 1/2008 | Hashimoto et al. | 257/103 |
| 2008/0135853 A1* | 6/2008 | Craven et al. | 257/76 |

FOREIGN PATENT DOCUMENTS

| | | |
|---|---|---|
| EP | 1385196 | 2/2004 |
| JP | 2001257166 | 9/2001 |
| JP | 2001342100 | 12/2001 |
| JP | 2002076329 | 3/2002 |
| JP | 2002076521 | 3/2002 |
| WO | 03/089694 | 10/2003 |
| WO | 04/061909 | 7/2004 |
| WO | 04/061969 | 7/2004 |
| WO | 05/064643 | 7/2005 |

OTHER PUBLICATIONS

Grandjean, N. et al., "Nitridation of sapphire. Effect on the optical properties of GaN epitaxial overlayers," Appl. Phys. Lett., 1996, pp. 2071-2073, vol. 69, No. 14.

Grzegorczyk et al., "Influence of sapphire annealing in trimethylgallium atmosphere on GaN epitaxy by MOCVD," J. Cryst. Growth, 2005, pp. 72-80, vol. 283.

Keller, S. et al., "Indium-surfactant-assisted growth of high-mobility AlN/GaN multilayer structures by metalorganic chemical vapor deposition," Appl. Phys. Lett., 2001, pp. 3449-3451, vol. 79, No. 21.

Matsuoka, T. et al., "N-polarity GaN on sapphire substrates grown by MOCVD," phys. stat. sol. (b), 2006, pp. 1446-1450, vol. 243, No. 7.

Naoi et al., "The effect of substrate polarity on the growth of InN by RF-MBE," J. Cryst. Growth, 2004, pp. 155-161, vol. 269.

Zauner, A.R.A., et al., "Homo-epitaxial GaN growth on exact and misorientented single crystals: suppression of hillock formation," J. Cryst. Growth, 2000, pp. 435-443, vol. 210.

Zauner, A.R.A., et al., "Homo-epitaxial GaN growth on the N-face of GaN single crystals: the influence of the misorientation on the surface morphology," J. Cryst. Growth, 2002, pp. 14-21, vol. 240.

Zauner et al., "Homo-epitaxial growth on misoriented GaN substrates by MOCVD," Mat. Res. Soc. Symp., vol. 595, 2000 Materials Research Society, pp. W6.3.1-W.3.6.

International Search Report mailed Sep. 23, 2008, International application No. PCT/US07/020037, International filing date Sep. 14, 2007.

Tsuchiya, H., et al., "Growth condition dependence of GaN crystal structure on (0 0 1)GaAs by hydride vapor-phase epitaxy" J. of Crystal Growth (189/190), 1998, pp. 395-400.

Usui, A. et al., "Thick GaN Epitaxial Growth with Low Dislocation Density by Hydride Vapor Phase Epitaxy," Jpn. J. Appl. Phys. 1997, pp. L899-L902, vol. 36(Part 2, 7B).

Vanfleet et al., "Defects in m-face GaN films grown in halide vapor phase epitaxy on LiAlO$_2$ ", Applied Physics Letters, vol. 83 No. 6 (Aug. 11, 2003).

Waltereit, P., et al., "Nitride semiconductors free of electrostatic fields for efficient white light-emitting diodes" Nature vol. 406, Aug. 24, 2000, pp. 865-868.

Wang, F. et al., "Crystal Tilting in the Epitaxial Laterally Overgrown GaN Films on Sapphire Substance by Hydride Vapor Phase Epitaxy," Solid State and Integrated-Circuit Technology Proceedings, 6th International Conference, Oct. 2001, vol. 2, pp. 1998-1201.

Waltereit et al., "M-Plane GaN(1 1 0 0) Grown ON γ-LiAlO$_2$ (1 0 0): Nitride Semiconductors Free of Internal Electrostatic C Fields," Journal of Crystal Growth 227-227 (2001), pp. 437-441.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et al., "Reduction of Lasing Threshold Current Density by the Lowering of Valence Band Effective Mass" J. of Lightwave Tech. vol LT-4 (5), May 1986, pp. 504-506.

Yu, Z., et al., "Epitaxial lateral overgrowth of GaN on SiC and sapphire substrates" MRS Internet J. Nitride Semicond. Res. 4S1, G4.3 (1999).

Zheleva, T., et al., "Dislocation density reduction via lateral epitaxy in selectively grown GaN structures" Appl. Phys. :ett. 71 (17), Oct. 27, 1997, pp. 2472-2474.

Zheleva, T., et al., "Pendo-epitaxy- A new approach for lateral growth of gallium nitride structures" MRS Internet J. Nitride Semicond. Res. 4S1, G3.38 (1999).

Fehlberg et al., "Characterisation of multiple carrier transort in indium nitride grown by molecular beam epitaxy," International Workshop on Nitride Semiconductors 2006, Phys. Stat. Sol. (c) 4, No. 7, pp. 2423-2427.

Heikman et al., "Growth of Fe doped semi-insulating GaN by metalorganic chemical vapor deposition," App. Phys. Lett. 81(3), 2002, pp. 439-441.

Poblenz et al., "Effect of carbon doping on buffer leakage in AlGaN/GaN high electron mobility transistors," J. Vac. Sc. Technol. B 22(3), 2004, pp. 1145-1149.

Poblenz et al., Effect of AlN nucleation layer growth conditions on buffer leakage in AlGaN/GaN high electron mobility transistors grown by molecular beam epitaxy (MBE), J. Vac. Sci. Technol. B 23(4), 2005, pp. 1562-1567.

Rajan, S. et al., "Growth and electrical characteriazation of n-face AlGaN/GaN heterostructures," Japanese Journal of Applied Physics, 2005, vol. 44, No. 29, pp. L1478-L1480.

Ramachandran, V. et al., "Inversiion of wurtzite GaN(0001) by exposure to magnesium," Applied Physics Letters, Aug. 9, 1999, vol. 75, No. 5, pp. 808-810.

Sharma et al., "Demonstration of a semipolar (1013) InGaN/GaN green light emitting diode," Applied Physics Letters, Nov. 2005, vol. 87, 231110, pp. 1-3, abstract.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved Photoluminescence as a probe of internal electric fields in GaN-(GaAl)N quantum wells" Phys. Rev. B. 59 (23), Jun. 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1999-I, pp. 1496-1499.

Leroux et al., "Quantum confined Stark effect due to built-in internal polarization fields in (Al,Ga)N/GaN quantum wells", Phys. Rev. B 58, R113371 (1998).

Leszczynski, M., et al., "Lattice parameters of gallium nitride" Appl. Phys. Lett. 69 (1), Jul. 1, 1996, pp. 73-75.

Liu, L. et al., "Substrates for gallium nitride epitaxy," Materials Science and Engineering R, Reports : A Review Journal, vol. 37, No. 3, Apr. 30, 2002, pp. 61-127, XP004349792.

Marchand, H. et al., "Mechanisms of lateral epitaxial overgrowth of gallium nitride by metalorganic chemical vapor deposition," Journal of Crystal Growth, vol. 195, No. 1-4, Dec. 15, 1998, pp. 328-332, XP004154283.

Marchand, H., et al., "Microstructure of GaN laterally overgrown by metalorganic chemical vapor deposition" Appl. Phys. Lett. . 73 (6), Aug. 10, 1998, pp. 747-749.

Marchand, H., et al., "Atomic force microscopy observation of threading dislocation density reduction in lateral epitaxial overgrowth of gallium nitride by MOCVD" MRS Internet J. Nitride Semicond. Res. 3, 3 (1998), pp. 1-7.

Maruska, S.P. et al., "Development of 50 mm Diameter Non-Polar Gallium Nitride Substrates for Device Applications," International Conference of Indium Phosphide and Related Materials, May 16, 2003, pp. 567-570.

Masui, H. et al., "Polarized Light Emission From Non-Polar InGaN Light-Emitting Diodes Grown on a Bulk m-Plane GaN Substrate," Jpn. J. Appl. Phys., 2005, pp. L1329-L2332, vol. 44, No. 43.

Metzger, T., et al., "X-Ray Diffraction Study of Gallium Nitride Grown by MOCVD" Physica status solidi (b) 193, 1996, pp. 391-397.

Miller et al., "Electric field dependence of optical absorption near the band gap of quantum-well structures", The American Physical Society, Physical Review B, vol. 32 No. 2 (Jul. 15, 1985).

Mills, A., "Wide-bandgap emitters continue to improve," III-Vs Review, vol. 13, No. 3, May 2000, pp. 23-24, 26, 28-30, XP004200697.

Moe, C.G. et al., "Milliwatt Power. Deep Ultraviolet Light Emitting Diodes Grown on Silicon Carbide," Jpn. J. Appl. Phys. 2005, pp. L502-L504, vol. 44(7).

Monemar, B., et al., "Properties of Zn-doped VPE-grown GaN.I. Luminescence data in relation to doping conditions" J. Appl. Phys. 51 (1), Jan. 1980, pp. 625-639.

Moran, B. et al., "Structural and morphological evolution of GaN grown... layer," J. Cryst. Growth, 2004, 273:38-47.

Moustakas, T.D. et al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a starting Substrate" Jpn. J. Appl. Phys. vol. 40 (2), (2001), pp. L140-L143.

Mukai et al., "Ultraviolet InGaN and GaN Single-Quantum-Well-Structure Light-Emitting Diodes Grown on Epitaxially Laterally Overgrown GaN Substrates", Jpn. J. Appl. Phys., vol. 38, pp. 5735-5739 (1999).

Nakamura, S., "GaN Growth Using GaN Buffer Layer," Jpn. J. Appl. Phys., 1991, 30(10A):L1705-L1707.

Nakamura, S. et al., The Blue Laser Diode, (Springer, Heidelberg, 1997), pp. 160-178.

Nakamura, S, et al., "Violet InGaN/GaN/AlGaN-Based Laser Diodes Operable at 50°C with a Fundamental Transverse Mode" Jpn. J. Appl. Phys. 38 (2), 1999, pp. L226-L229.

Nam, O., et al., "Lateral epitaxy of low defect density GaN layers via organometallic vapor phase epitaxy" Appl. Phys. Lett. 71 (18), Nov. 3, 1997, pp. 2638-2640.

Nataf, G., et al., "Lateral overgrowth of high quality GaN layers on GaN/Al$_2$O$_3$ patterned substrates by halide vapour-phase epitaxy" J. of Crystal Growth (192), Feb. 20, 1998, pp. 73-78.

NG, H.M., "Molecular-beam epitaxy of GaN/Al$_x$Ga$_{1-x}$N multiple quantum wells on R-plane (1012) sapphire substrates" Appl. Phys. lett. 80 (23), Jun. 10, 2002, pp. 4369-4371.

Nishida, T., et al., "Ten Milliwatt Operation of an AlGaN-Based Light Emitting Diode Growth on GaN Substrate" Phys. Stat. Sol. (a) 188 (1), 2001, pp. 113-116.

Nishizuka, K. et al., "Efficient radiative recombination from <1122>-oriented in In$_x$Ga$_{1-x}$N multiple quantum wells fabricated by the regrowth technique," Appl. Phys. Lett. 2004, pp. 3122-3124, vol. 85(15).

Ohba, Y. et al., "A study on strong memory effects for Mg doping in GaN metalorganic chemical vapor deposition," J. Cryst. Growth 1994, pp. 214-218, vol. 145.

Okamoto, K. et al., "Dislocation-Free m-Plane InGaN/GaN Light-Emitting Diodes on m-Plane GaN Single Crystals," Jpn. J. Appl. Phys., 2006, pp. L1197-L1199, vol. 45, No. 45.

Okamoto, K. et al., "Near-field scanning optical microscopy of photonic crystal nanocavities," Appl. Phys. Lett. 2003, pp. 1676-1678, vol. 82(11).

Park, J., et al., "Selective-area and lateral epitaxial overgrowth of III-N materials by metal organic chemical vapor depostion" Appl. Phys. Lett. 73 (3), Jul. 20, 1998, pp. 333-335.

Park, S., et al., "Spontaneous polarization effects in wurtzite GaN/AlGaN quantum wells and comparison with experiment" Appl. Phys. Lett. 76 (15), Apr. 10, 2000, pp. 1981-1983.

Parilliaud, O., et al., "Localized Epitaxy of GaN by HVPE on patterned Substrates" MRS Internet J. Nitride Semicond. res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Pearton et al., "GaN: Processing, defects, and devices", Applied Physics Reviews, Journal of Applied Physics, vol. 86, No. 1 (jul. 1, 1999).

Rosner, S.J., et al., "Cathodoluminescence mapping of epitaxial lateral overgrowth in gallium nitride" Appl. PHys. Lett. 74 (14), Apr. 5, 1999, pp. 2035-2037.

Sakai, A., et al., "Self-organized propagation of dislocations in GaN films during epitaxial lateral overgrowth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Sasaki, T. et al., "Substrate-orientation dependence of GaN single-crystal films grown by metalorganic vapor-phase epitaxy," Journal of Applied Physics, American Institute of Physics, vol. 61, No. 7, Apr. 1, 1987, pp. 2533-2540, XP000820119.

Schmidt, H. et al., "Giant Kerr nonlinearities obtained by electromagnetically induced transparency," Optics Lett. 1996, pp. 1936-1938, vol. 21(23).

Schmidt, E. et al., "Mutational. Profile of the PTEN Gene in Primary Human Astrocytic Tumors and Cultivated Xenografts," J. Neur. Exp. Neur. 1999, pp. 1170-1183, vol. 58(11).

Seo. L.J. et al., "Reduction of oscillator strength due to piezoelectric fields in GaN/$Al_x Ga_{1-x}$N quantum wells" Phys. Rev. B. 57 (16), Apr. 15, 1998-II, pp. R9435-R9438.

Shintani, A., et al., "Light Emitting Patterns of Gallium Nitride Electroluminescence" J. Electrochem. Soc. 123 (10) Oct. 1976, pp. 1575-1578.

Smorchkova, I.P., et al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Sun, C.J. et al/. "Comparison of the physical properties of GaN thin films deposited on (0001) and (0112) sapphire substrates," Applied Physical Letters, col. 63, No. 7, 1993, pp. 973-975, XP002251480.

Sun, Y.J. et al., "In surface segregation in M-plane (In,Ga)N/GaN multiple quantum well structures", Applied Physics Letters, vol. 83 No. 25 (Dec. 22, 2003).

Sun, Y.J. et al., "Nonpolar $In_x Ga_{1-x}$ N/GaN(1100) multiple quantum wells grown on $\gamma$-$LiAlO_2$(100) by plasma-assisted molecular-beam epitaxy", Physical Review B 67 (2003).

Takeuchi, T., et al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et al., "Quantum-Confined Stark Effect due to Piezoelectric Fields in GaInN Strained Quantum Wells" Jpn. J. Appl. Phys. vol. 36, Apr. 1, 1997, pp. L382-385.

Takeuchi et al., "Theoretical Study of Orientatuib Dependence of Piezoelectric Effects in Wurtzite Strained GaInN/GaN Heterostructures and Quantum Wells", Jpn. J. Appl. Phys. vol. 39, pp. 413-416, Part 1, No. 2A (Feb. 2000).

Tan, I.H., et. al., "A self consistent solution of Schrodinger-Poisson equations using a nonuniform mesh" J. Appl. Phys. 68 (8), Oct. 15, 1990, pp. 4071-4076.

Traetta et al., "Effects of the spontaneous polarization and piezoelectric fields on the luminescence spectra of GaN/$Al_{0.15} Ga_{0.85}$N quantum wells", Physica E 7, 929-933 (2000).

Ajoul et al., "Hydroger and Nitrogen Ambient Effects On Epitaxial Growth Of GaN By Hydride Vapour Phase Epitaxy," Journal of Crystal Growth 230 (2001), pp. 372-376.

Amano, H. et al., "Metalorganic vapor phase epitaxial growth of a high quality GaN film using an AlN buffer layer" Applied Physics Letters, vol. 48, No. 5, Feb. 3, 1986, pp. 353-355.

Amano et al., "Stress and Defect Control in GaN Using Low Temperature Interlayers", Jpn. J. Appl. Phys., vol. 37 (1998).

Ambacher, O. et al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233, Aoki, M. et al., "GaN single crystal growth using high-purity Na as a flux," J. of Crystak Growth 2002, pp. 70-76, vol. 242.

Bernardini et al., "Spontaneous polarization and piezoelectric constants of III-V nitrides", Phys. Rev. B 56, R10024 (1997).

Bhattacharyya et al., "Comparative study of GaN/AlGaN MQWs grown homoepitaxially on (1 1 0 0) and (0001) GaN", Crystal Growth 251, 487 (2003).

Bigenwald et al., "Confined Excitions in GaN-AlGaN Quantum Wells", Phys. Stat. Sol. (b) 216, 371 (1999).

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Chakraborty, A. et al., "Defect reduction in nonpolar a-plane GaN films using in situ $SiN_x$ nanomask," Appl. Phys. Lett. 2006, pp. 041903-1-041903-3, vol. 89.

Chakraborty, A. et al., "Demonstration of Nonpolar m-plane in GaN/GaN Light Emitting Diodes on Free-Standing m-plane GaN Substrates," Jpn, J. of Appl. Phys. 2005, pp. L173-L175, vol. 44(5).

Chakraborty, A. et al., "Nonpolar InGaN/GaN emitters on reduced-defect lateral epitaxially overgrown a-plane GaN with drive-current-independent electroluminescence emission peak", Applied Physics Letters vol. 85 No. 22, (Nov. 29, 2004).

Chen, C. et al., "A New Selective Area Lateral Epitaxy Approach for Depositing a-plane GaN over r-Plane Sapphire," Jpn. J. Appl. Phys. 2003, pp. L818-L820, vol. 42 (Part 2, No. 7B).

Chitnis et al., "Visible light-emitting diodes using a-plane GaN-InGaN multiple quantum wells over r-plane sapphire", Applied Physics Letters vol. 84 No. 18 (May 3, 2004).

Craven, M.D. et al., "Characterization of a-Plane GaN/(Al,Ga)N Multiple Quantum Wells Grown via Metalorganic Chemical Vapor Deposition" Jpn. J. Appl. Phys. vol. 42, (2003), pp. L235-L238.

Craven, M.D. et al., "Structural characterization of nonpolar (1120) a-plane GaN thin films grown on (1120) r-plane sapphire," Applied Physics Letters, vol. 81, No. 3, Jul. 15, 2002, pp. 469-471.

Craven, M.D. et al., "Threading dislocation reduction via laterally overgrown nonplar (1120) a-plane GaN," Appl. Phys. Lett. 81 (7), Aug. 12, 2002, pp. 1201-1203.

Dovidenko, K. et al., Characteristics of stacking faults in AlN thin films. J. Appl. Phys. 82 (9), Nov. 1, 1997, pp. 4296-4299.

Dupuis, R.D. et al., "Selective-area and lateral epitaxial overgrowth of III-N materials by metalorganic chemical vapor deposition," Journal of Crystal Growth, vol. 195, No. 1-4, Dec. 15, 1998, pp. 340-345, XP004154285.

Dwilinski, R. et al., "AMMONO method of BN, AlN and GaN synthesis and crystal growth," MRS Internet Journal Nitride Semiconductor Research 3, 25, 1998, pp. 1-4.

Dwilinski, R. et al., "AMMONO method of GaN and AlN production," Diamond and Related Materials, 1998, pp. 1348-1350, vol. 7.

Eastman, L.F., "The Toughest Transistor Yet" IEEE Spectrum 29 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-445.

Etzkorn, E.V. et al., "Cracking of GaN films" J. Appl. Phys. 89 (2), Jan. 15, 2001, pp. 1025-1034.

Freitas, J.A. Jr., et al., "Optical characterization of lateral epitaxial overgrown GaN layers" Appl. Phys. Lett. 72 (23), Jun. 8, 1998, pp. 2990-2992.

Gardner et al., "Polarization anisotropy in the electroluminescence of m-plane InGaN-GaN multiple-quantum-well light-emitting diodes", Applied Physics Letters 86, 111101 (2005).

Ghandhi, VLSI Fabrication Principles: Silicon and Gallium Arsenide, $2^{nd}$ Ed., Wiley-Interscience, 1994, pp. 639-642.

Grandjean, N., et al., "Built-in electric-field effects in wurtzite AlGaN quantum wells" J. Appl. Phys. 86 (7), Oct. 1, 1999, pp. 3714-3720.

Grandjean et al., "Self-limitation of AlGaN/GaN quantum well energy by built-in polarization field", Applied Physics Letters, vol. 74, No. 16 (Apr. 19, 1999).

Grzegory, I. et al., "Seeded growth on GaN at high $N_2$ pressure on (0 0 0 1) polar surfaces on GaN single crystalline substrates," Materials Science in Semiconductor Processing, vol. 4, No. 6, Dec. 2001, pp. 535-541, XP004345737.

Gu et al., "The impact of initial growth and substrate nitridation on thick GaN growth on sapphire by hydride vapor phase epitaxy," Journal of Crystal Growth, vol. 231, No. 3, Oct. 2001, pp. 342-351.

Haskell et al., "Defect reduction in (1120) a-plane gallium nitride via lateral epitaxial overgrowth by hydride vapor-phase epitaxy", Applied Physics Letters, vol. 83 No. 4 (Jul. 28, 2003).

Haskell, B.A. et al., "Defect reduction in (1100) m-plane gallium nitride via lateral epitaxial overgrowth by hydride vapor phase epitaxy," Appl. Phys. Lett. 2005, pp. 111917-1111917-3, vol. 86.

Heying, B. et al., "Role of threading dislocation structure on the x-ray diffraction peak widths in epitaxial GaN films" Appl. Phys. Lett. 68 (5), Jan. 29, 1996, pp. 643-645.

IM, J.S. et al., "Reduction of oscillator strength due to piezoelectric fields in GaN/$Al_x Ga_{1-x}$ N quantum wells", Phys. Rev. B, vol. 57 No. 16 (Apr. 15, 1998).

Inoue, T. et al., "Pressure-Controlled Solution Growth of Bulk GaN Crystals under High Pressure," Phys. Stat. Sol. (b) 2001, pp. 1-27, vol. 223(15).

Iwahashi, T. et al., "Effects of ammonia gas on threshold pressure and seed growth for bulk GaN single crystals by Na flux method," J. Crystal Growth 2003, pp. 1-5, vol. 253.

Iwata, K., et al., "Gas Source Molecular Beam Epitaxy Growth of GaN on C-, A-, R-, and M-Plane Sapphire and Silica Glass Substrates" Jpn. J. Appl. Phys. vol. 36 (1997), pp. L661-L664.

Iwaya, M. et al., "Reduction of Etch Pit Density in Organometallic Vapor Phase Epitaxy-Grwon GaN on Sapphire by Insertion of a Low-Temperature-Deposited Buffer Layer between High-Temperature-Grown GaN," Jpn. J. Appl. Phys. 1998, pp. L316-L318, vol. 37.

Kapolnek, D., et al., "Anisotropic epitaxial lateral growth in GaN selective area epitaxy" Appl. Phys. Lett. 71 (9), Sep. 1, 1997, pp. 1204-1206.

Keller et al., "Metalorganic Chemical Vapor Deposition Growth of High Optical Quality and High Mobility GaN", J. Electronic Materials vol. 24, pp. 1707-1709 (1995).

Kim, H-M. et al., "High-Brightness Light Emitting Diodes Using Dislocation-Free Indium Gallium Nitride/Gallium Nitride Multiquantum-Well Nanorod Arrays," Nono Letters 2004, pp. 1059-1062, vol. 4(6).

Kinoshita et al., "Emission Enhancement of GaN/AlGaN Single-Quantum-Wells Due to Screening of Piezoelectric Field", MRS Internet J. Nitride Semicond. Res. 5, W11.32 (2000).

Koleske, D.D. et al., "Understanding GaN nucleation layer evolution on sapphire," J. Cryst. Growth, 2004, 273:86-99.

Kuokstis, E. et al., "Polarization effects in photoluminescence of C- and M-plane GaN/AlGaN multiple quantum wells," Appl. Phys. Lett. 2002, pp. 4130-4132, vol. 81(22).

Langer, R., et al., "Giant electric fields in unstrained GaN single quantum wells" Appl. Phys. Lett., 74 (25), Jun. 21, 1999. pp. 3827-3829.

\* cited by examiner

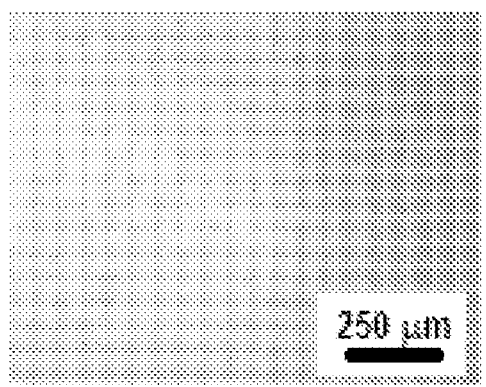
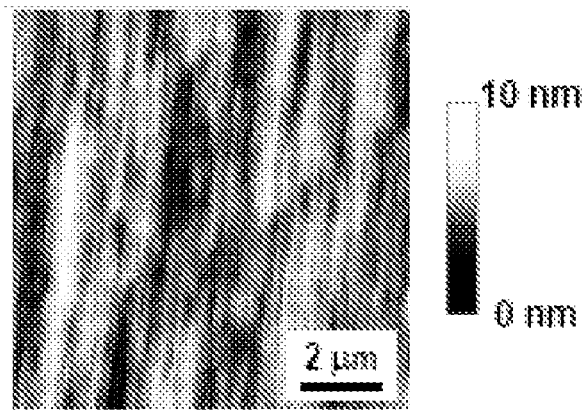
FIG. 5(a)  FIG. 5(b)

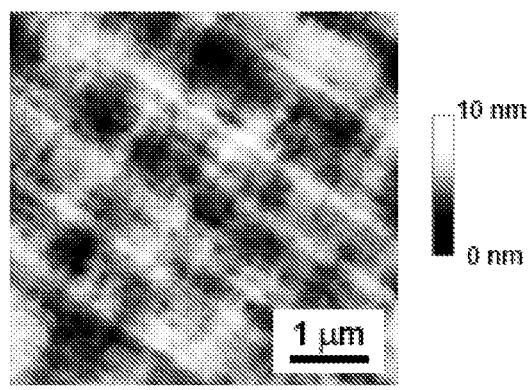 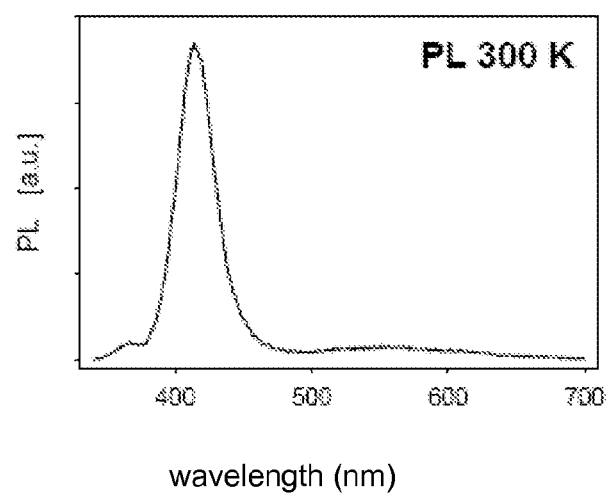
FIG. 7(a)  FIG. 7(b)

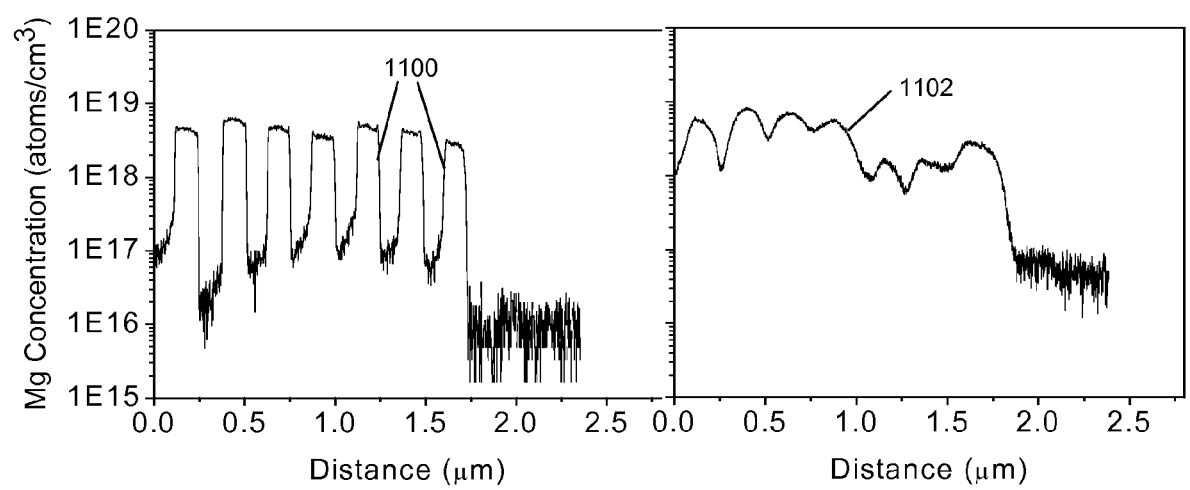
FIG. 11(a)  FIG. 11(b)

FIG. 12a
FIG. 12b
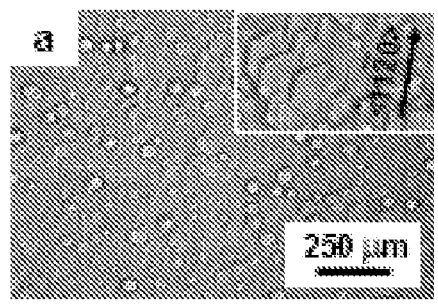
0.5° toward A
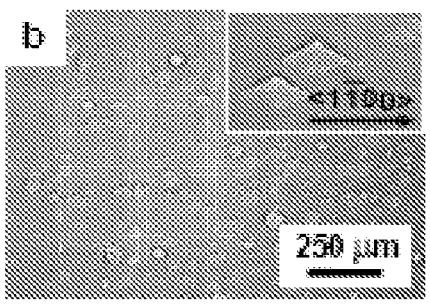
0.5° toward M
FIG. 12c
FIG. 12d
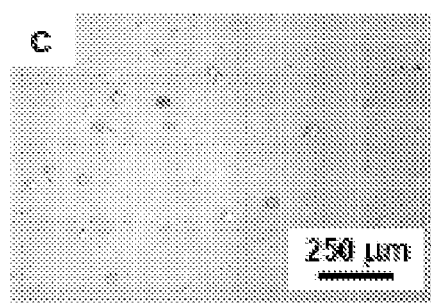
1° toward A
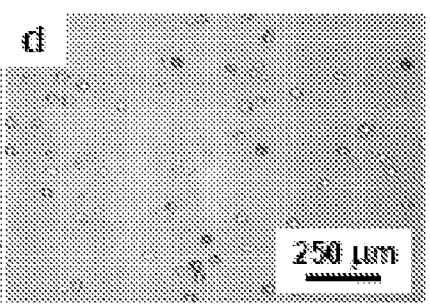
1° toward M
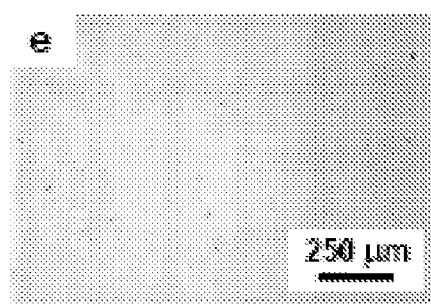
2° toward A
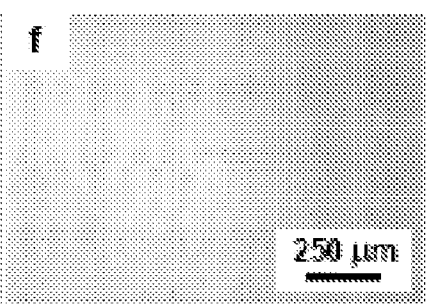
2° toward M
FIG. 12e
FIG. 12f

METHOD FOR HETEROEPITAXIAL GROWTH OF HIGH-QUALITY N-FACE GAN, INN, AND AIN AND THEIR ALLOYS BY METAL ORGANIC CHEMICAL VAPOR DEPOSITION

CROSS-REFERENCE TO RELATED APPLICATIONS

This application claims the benefit under 35 U.S.C. Section 119(e) of the following co-pending and commonly-assigned U.S. patent application: U.S. Provisional Application Ser. No. 60/866,035 filed on Nov. 15, 2006, by Stacia Keller, Umesh K. Mishra and Nicholas A. Fichtenbaum, entitled "METHOD FOR HETEROEPITAXIAL GROWTH OF HIGH-QUALITY N-FACE GaN, InN, AND AlN AND THEIR ALLOYS BY METAL ORGANIC CHEMICAL VAPOR DEPOSITION,"

which application is incorporated by reference herein.

This application is related to the following co-pending and commonly-assigned applications:

U.S. patent application Ser. No. 11/523,286, filed on Sep. 18, 2006, by Siddharth Rajan, Chang Soo Suh, James S. Speck, and Umesh K. Mishra, entitled "N-POLAR ALUMINUM GALLIUM NITRIDE/GALLIUM NITRIDE ENHANCEMENT-MODE FIELD EFFECT TRANSISTOR", which claims priority to U.S. Provisional Patent Application Ser. No. 60/717,996, filed on Sep. 16, 2005, by Siddharth Rajan, Chang Soo Suh, James S. Speck, and Umesh K. Mishra, entitled "N-POLAR ALUMINUM GALLIUM NITRIDE/GALLIUM NITRIDE ENHANCEMENT-MODE FIELD EFFECT TRANSISTOR", and U.S. Provisional Patent Application Ser. No. 60/866,019, filed on Nov. 15, 2006, by Nicholas A. Fichtenbaum, Umesh K. Mishra, and Stacia Keller, entitled "LIGHT EMITTING DIODE AND LASER DIODE USING N-FACE GaN, InN, and AlN AND THEIR ALLOYS", which applications are incorporated by reference herein.

BACKGROUND OF THE INVENTION

1. Field of the Invention

This invention is related to growth of Group III nitride materials, and in particular to a method of heteroepitaxial growth of high quality, Nitrogen (N) face Gallium Nitride (GaN), Indium Nitride (InN), Aluminum Nitride (AlN), and their alloys, by Metal Organic Chemical Vapor Deposition (MOCVD).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The use of group III nitride materials in consumer applications and devices is becoming widespread. However, the majority of applications employ Ga-polar group-III nitride films and heterostructures. Films and heterostructures of the opposite polarity (N-polar group-III nitride films and heterostructures) have been much less investigated due to difficulties in their growth. N-polar group-III nitride films and heterostructures are advantageous for the fabrication of a variety of nitride based electronic and optoelectronic devices. The opposite direction of the piezoelectric fields in N-polar heterostructures, in comparison to Ga-polar heterostructures, allows the fabrication of transistor devices which cannot be fabricated using Ga-polar heterostructures.

One of the major challenges to III-Nitride based light emitters is the growth of high quality InGaN with high In composition. The use of the Gallium (Ga)-face for devices limits the temperature at which the InGaN can be grown, which limits the types of devices that can be made. Another challenge is the growth of low resistance p-type (Al,Ga,In)N:Mg films due to polarity conversion from Ga-face to N-face at high Mg doping levels. By using N-face (Al,Ga,In)N layer structures both issues can be mitigated.

The opposite direction of the piezoelectric fields in N-polar in comparison to Ga-polar heterostructures leads to a lower operating voltage of Light Emitting Diodes (LEDs) and Laser Diodes (LDs), and to improved carrier injection in p-n junction devices, due to a narrower width of the depletion region in general. Furthermore, the opposite direction of the piezolelectric fields has advantages for devices such as transistors, solar cells and devices utilizing tunnel junctions. It can be seen that there is a need in the art for N-face nitride materials and methods to grow these materials.

SUMMARY OF THE INVENTION

The present invention describes growth of Group III nitride materials, and in particular a method of heteroepitaxial growth of high quality, N-face GaN, InN, AlN, and their alloys, and heterostructures comprising the same grown by MOCVD.

A method for growing an N-face group III nitride film in accordance with the present invention comprises providing a substrate having a growth surface with a misorientation angle between 0.5 and 10 degrees in any direction relative to a miller indexed crystallographic plane [h, i, k, l] of the substrate, where h, i, k, l are miller indices; and growing the N-face group III-nitride film on the growth surface, wherein the group III-nitride film having an N-face is smoother than an N-face group III-nitride film grown on a substrate without a misorientation angle.

If sapphire is used as substrate, such a method further optionally comprises a misorientation of the [0001] sapphire with a direction of <11-20>, the miller indices of the misorientation direction are h=1, i=1, k=−2 and l=0 or equivalent. If the substrate is [000-1] C-face silicon carbide, such a method optionally comprises a misorientation with a misorientation direction of <1-100>, the miller indices of the mirorientation direction are h=1, i=−1, k=0 and l=0 or equivalent.

Such a method can further optionally comprise the growing being by Metal Organic Chemical Vapor Deposition (MOCVD), the group III-nitride layer having an N-face being grown on a nitridized misoriented substrate, forming an AlN layer on the misoriented substrate and growing the group III-nitride layer having an N-face on the AlN layer, the AlN layer being deposited using a step flow growth mode, the AlN layer setting an N-polarity for subsequently deposited group III-nitride layers, the misoriented substrate being a sapphire substrate, depositing a group III-nitride nucleation layer on an AlN layer formed on the sapphire substrate due to the nitridization, and growing the main group III-nitride layer on the group III-nitride nucleation layer, the group III-nitride nucleation layer being deposited using a step flow growth mode or layer by layer growth mode, the group III-nitride nucleation layer being at least partially doped, the growing of the group III-nitride layer having an N-face comprises doping and growing, on the nucleation layer, a first group III nitride layer having an N-face, using a low ammonia partial pressure and growing a second group III-nitride layer having an N-face, on the first group-III layer having an N-face, at a high ammonia partial pressure, so that at least part of the second group III-nitride layer having an N-face is doped, the misoriented substrate being a polished Carbon Polar Silicon Carbide substrate, and depositing a graded or stepped group III-nitride layer, e.g., the layer has a changing composition of one of the elements used to make up the layer, on the AlN layer, wherein an Al composition of the graded or stepped group III-nitride layer is graded or stepped from AlN to GaN.

Additional optional items in accordance with the present invention include the graded group III-nitride layer is at least partially doped, the growing of the group III-nitride layer having an N-face comprises doping and growing, on the graded group III-nitride layer, a first group III-nitride layer having an N-face, using a low ammonia partial pressure, and growing a second group III-nitride layer having an N-face, at a high ammonia partial pressure, so that at least part of the second group III-nitride layer having an N-face is doped, and a device fabricated using the method.

Another method for creating a group III-nitride film with an abrupt p-type doping profile in accordance with the present invention comprises providing a substrate having a growth surface with a misorientation angle between 0.5 and 10 degrees relative to a miller indexed crystallographic plane [h, i, k, l] of the substrate, where h, i, k, l are miller indices; and growing the N-face group III-nitride film having an abrupt p-type doping profile on the growth surface, wherein the group III-nitride film having an N-face is smoother than an N-face group III-nitride film grown on a substrate without a misorientation angle.

Another method for enhancing charge transport properties of a nitride device in accordance with the present invention comprises fabricating the nitride device using N-face nitride layers grown on a substrate having a growth surface with a misorientation angle between 0.5 and 10 degrees relative to a miller indexed crystallographic plane [h, i, k, l] of the substrate, where h, i, k, l are miller indices, and aligning a channel of the nitride device substantially perpendicular to a misorientation direction of the misoriented (Al, Ga, In)N epitaxial layer, wherein charge transport properties are enhanced perpendicular to the misorientation direction.

BRIEF DESCRIPTION OF THE DRAWINGS

Referring now to the drawings in which like reference numbers represent corresponding parts throughout:

FIG. 5($a$) shows an optical microscope image of an N-face GaN film grown by MOCVD on a nitrided sapphire substrate, and FIG. 5($b$) shows an atomic force microscope (AFM) image of N-face GaN grown by MOCVD on a nitrided sapphire substrate

FIG. 11($a$) and 11($b$) are graphs of SIMS results of Mg incorporation in an N-face (FIG. 11($a$)) and a Ga-face (FIG. 11($b$)) GaN SIMS stack.

FIGS. 12$a$-12$f$ illustrate optical micrographs of 0.8 micron thick GaN films grown on sapphire substrates in accordance with the present invention.

DETAILED DESCRIPTION OF THE INVENTION

Figure 1:
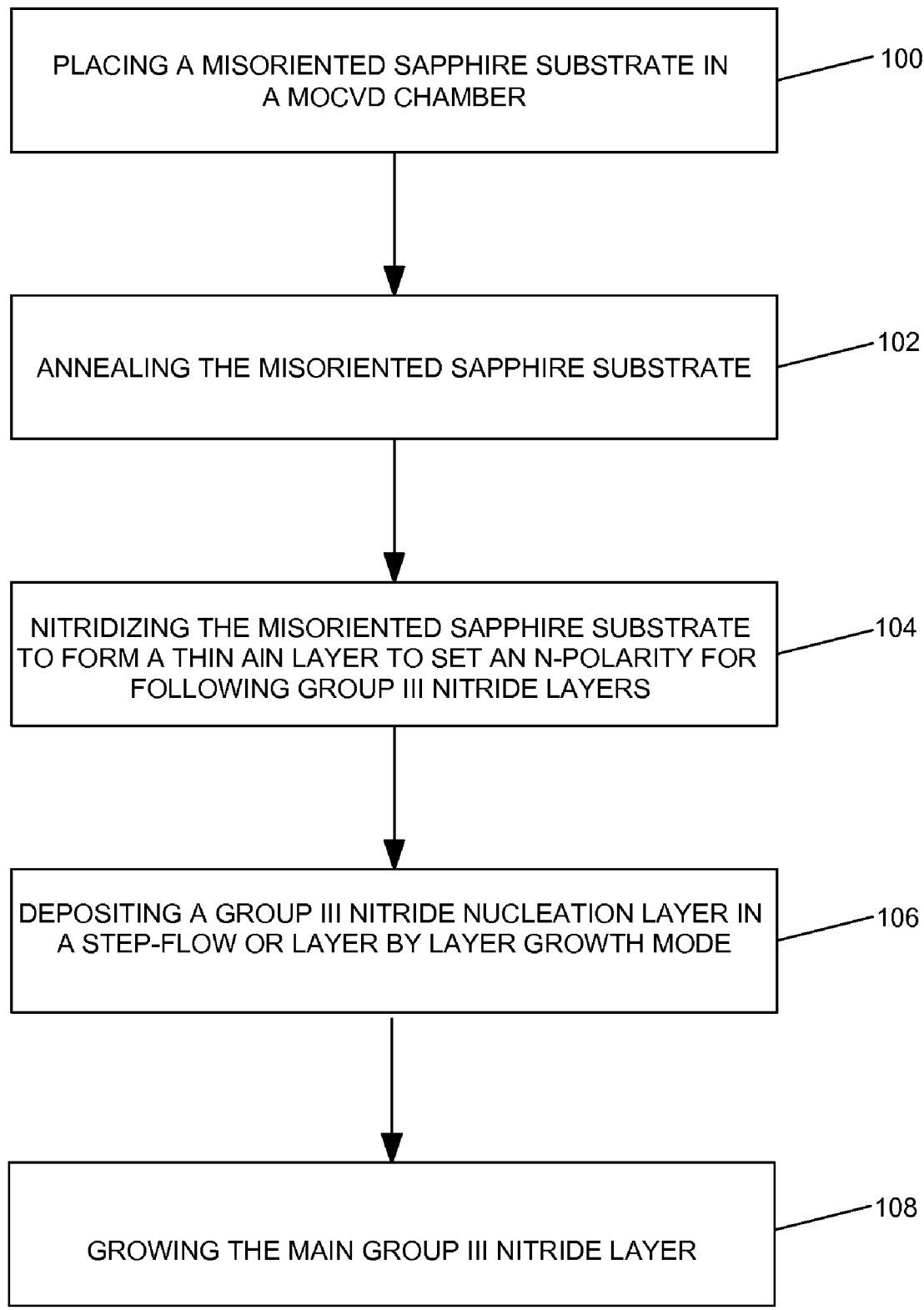
FIG. 1 illustrates a process chart in accordance with the present invention, for the growth on sapphire.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

This invention will allow for the creation of transistors that cannot be fabricated on traditional Ga-polar GaN. The present invention will also allow novel polarization-based band structure designs to create more efficient LEDs and LDs. The reverse polarization fields in N-polar heterostructures, in comparison to Ga-polar heterostructures, result in lower operating voltages, shrink the width of the depletion region of the p-n-junction, and improve carrier injection, leading to advances in device performance. Deposition on N-polar surfaces enables the growth of InGaN with higher compositions of Indium compared to Ga-polar surfaces, easing the push of LED wavelengths into the yellow and red portions of the color spectrum. Additionally, the present invention enables the use of higher p-type doping levels in GaN based devices, leading to improved device performance. Further, novel electronic and optoelectronic nitride devices such as N-face transistors (HEMTs), N-face LEDs, and N-face LDs, will be possible using the materials grown using the present invention.

This invention enables the heteroepitaxial growth of high quality, smooth N-face (000-1) InN, GaN, AlN films, and their alloys, by MOCVD. Since free standing GaN substrates are not readily available and affordable, GaN is usually grown heteroepitaxially on Silicon Carbide (SiC), Sapphire, Si, and various other substrates.

The group III-Nitrides have large built-in polarization fields centered about the direction which makes the direction, and hence face of growth, an extremely important parameter in the growth and design of devices. Traditionally all III-Nitride growth is performed on the (0001) III-face. Since this invention allows N-face growth, new transistor (HEMTs), LEDs and LDs designs will be possible through the different physical properties provided by N-face. For HEMTs, the (000-1) N-face allows, for example, the design of structures with extremely low gate leakages for high power, high frequency device operation. For light emitters (LEDs, and LDs)

the N-face enables the growth of better quality, high Indium composition InGaN alloys, which are currently needed to create high power devices in the green, yellow, and red parts of the color spectrum. Additionally, traditional Ga-face GaN suffers from inversion, while N-face GaN does not, when doped highly with Mg, which is need to create p-type GaN. Higher p-type carrier concentrations should drastically increase device performances. Moreover, the reverse polarization fields in N-face in comparison to Ga-face heterostructures lower the operating voltage of LEDs and LDs. This also results in a narrower width of the depletion region of the p-n-junction and improved carrier injection leading to advances in the device performance.

Whereas smooth N-face GaN films can be easily obtained on C-face SiC substrates using Molecular Beam Epitaxy (MBE) as growth techniques, films grown by MOCVD typically exhibit rough surfaces caused by the formation of hexagonal hillocks, independent of whether the GaN layers were grown on small GaN single crystals or on foreign substrates, hampering the development of N-face devices. [1, 2, 3] However, investigations on GaN single crystals showed that the hillock formation can be largely suppressed if the MOCVD growth is performed on miscut GaN crystals [2,3]. More recently, smooth N-face GaN films were also obtained on sapphire substrates by Matsuoka et al. [4].

The present invention utilizes a misoriented substrate, for example (0001) sapphire or (000-1) SiC, which are misoriented for example in the <1-100> or <11-20> direction in order to obtain smooth N-face films grown by MOCVD. Thereby the technique can be applied to any foreign substrate, e.g., sapphire, SiC or Si.

Thereby, for growth on sapphire, the preferred substrate misorientation direction is <11-20>, leading to group-III nitride surface steps and/or undulations parallel to the <11-20> direction of the GaN crystal. For growth on carbon-polar silicon carbide, the preferred substrate misorientation direction is <1-100>, also leading to group-III nitride surface steps and/or undulations parallel to the <11-20> direction of the GaN crystal.

The preferred misorientation angle ranges between 1-5 degrees relative to a miller indexed surface [h, i, k, l] of the substrate, where h, i, k, l are miller indices. All misorientation angles and directions are given with respect of either the (0001) (=c-plane) sapphire surface (=plane) or the (000-1) SiC substrate surface. Both are suitable for the growth of (000-1) GaN. The present invention can also work for the growth of other N-terminated GaN planes on other substrate planes.

Technical Description

Growth on Sapphire

For growth on sapphire, the present invention is realized by:

a. Placing a misoriented sapphire substrate in the MOCVD reactor and annealing at around 1090° C. surface temperature in a $H_2$ environment.

b. The substrate is then nitridized in $NH_3$ and $H_2$ for several seconds at approximately 980° C. surface temperature, leading to the formation of a thin AlN layer on the sapphire which sets the N-face polarity of the growth.

c. $NH_3$ and Trimethylgallium (TMG) are then flowed into the reactor to commence growth of GaN on the AlN. Thereby, first an about 20 nm thick GaN layer can be deposited at medium growth temperatures (surface temperature ~950° C.), leading to growth in a step-flow or layer-by-layer growth mode.

d. $NH_3$ and Trimethylgallium (TMG) are then flowed into the reactor to commence growth of the main GaN on the layer formed in step (c).

Currently, the growth method being used is MOCVD; however this invention could become quite useful for other growth methods such as MBE, Hydride Vapor Phase Epitaxy (HVPE), and Chemical Beam Epitaxy (CBE), etc.

The process described in part (c) applies very generally to GaN growth. However, the invention can be easily utilized to create InN (with the use of TMI), AlN (with the use of TMA), or any of their alloys, also with other group-V atoms (Al,Ga, In)(N,P,As), by combining the appropriate precursors.

Other precursors can be used such as triethylgallium, triethylaluminum for group-III sources, and dimethylhydrazine for N sources. Any appropriate substrate can be used, such as SiC, Si, spinel, etc. The nitridation temperature and time can be varied, or completely eliminated, dependent on the substrate. Other growth initiation procedures can be applied. For example, the growth can be initiated with the deposition of an AlN layer etc., or no growth initiation step might be required at all. Note that, while part (b) specifies the deposition of a thin AlN layer, any thickness of the AlN layer may be used, and nitride materials other than AlN may be used. The annealing of the substrate can be eliminated. The substrate can be misoriented not only towards the <11-20> and <1-100> directions, but also in any other direction. Instead of a single composition layer, the composition of the layer/crystal can be modified for all individual growth steps. The growth of each individual layer may also be interrupted for the deposition of layers comprised of other materials, for example silicon nitride or silicon oxide, possibly for strain or dislocation management.

FIG. 1 illustrates a process chart in accordance with the present invention.

Block 100 represents the step of placing a misoriented sapphire substrate in a MOCVD chamber.

Block 102 represents the step of annealing the misoriented sapphire substrate.

Block 104 represents the step of nitridizing the annealed misoriented sapphire substrate to form a thin AlN surface layer to set an N-polarity for following group III nitride layers. [7,8] Reference 7 describes the formation of the AlN layer, reference 8 is a theoretical calculation with the result that the AlN layer should be one bi-layer thick, corresponding to ~0.5 nm.

Block 106 represents the step of depositing, on the AlN surface layer, a group III nitride nucleation layer in a step-flow or layer-by-layer growth mode.

Block 108 represents the step of growing the main group III nitride layer on the nucleation layer.

Growth on Carbon Polar SiC

For growth on carbon (C) polar SiC, this invention is realized by:

a. Placing a misoriented, polished (e.g. chemo-mechanically polished) C-polar SiC substrate in the MOCVD reactor and annealing at around 1090° C. surface temperature in a $H_2$ environment.

b. $NH_3$ and Trimethylaluminum (TMA) are then flowed into the reactor to commence growth of a thin AlN layer in a step-flow-growth-mode or layer-by-layer growth mode. To increase the surface mobility of Al-species, a surfactant, for example indium, in form of trimethylindium (TMI), can be additionally flowed into the reactor [5].

c. Trimethylgallium (TMG) is then also optionally flowed into the reactor to commence the growth of a graded or stepped $Al_xGa_{1-x}N$ layer, the composition of which is graded or stepped from AlN to GaN. The injection of TMI can be continued to ensure a step-flow-growth-mode or layer-by-layer growth mode of the layer.

d. $NH_3$ and Trimethylgallium are then flowed into the reactor to commence growth of the main GaN layer.

Currently, the growth method being used is MOCVD; however this invention could become quite useful for other growth methods such as MBE, HVPE, CBE, etc.

The process described in part (c) applies very generally to GaN growth however, the invention can be easily utilized to create InN (with the use of TMI), AlN (with the use of TMA), or any of their alloys, also with other group-V atoms (Al, Ga, In)(N, P, As), by combining the appropriate precursors. Other precursors can be used such as triethylgallium, triethylaluminum for group-III sources, and dimethylhydrazine for N sources. Any appropriate substrate can be used, such as SiC, Si, spinel, etc. The nitridation temperature and time can be varied, or completely eliminated, dependent on the substrate. Other growth initiation procedures can be applied. For example, the growth can be initiated with the deposition of an AlGaN layer etc., or no growth initiation step might be required at all. Note that, while part (b) specifies the deposition of a thin AlN layer, any thickness of the AlN layer may be used, and nitride materials other than AlN may be used. The annealing step of the substrate can be eliminated. The graded or stepped AlGaN layer can be eliminated and be replaced by any (Al, Ga, In)N layer of any composition if grown in a step-flow-growth-mode or layer-by-layer-growth-mode. The substrate can be misoriented not only towards the <1-100> or <11-20> directions but also in any other direction. Instead of a single composition layer, the composition of the layer/crystal can be modified for all individual growth steps. The growth of each individual layer may also be interrupted for the deposition of layers comprised of other materials, for example silicon nitride or silicon oxide, possibly for strain or dislocation management.

Figure 2A:
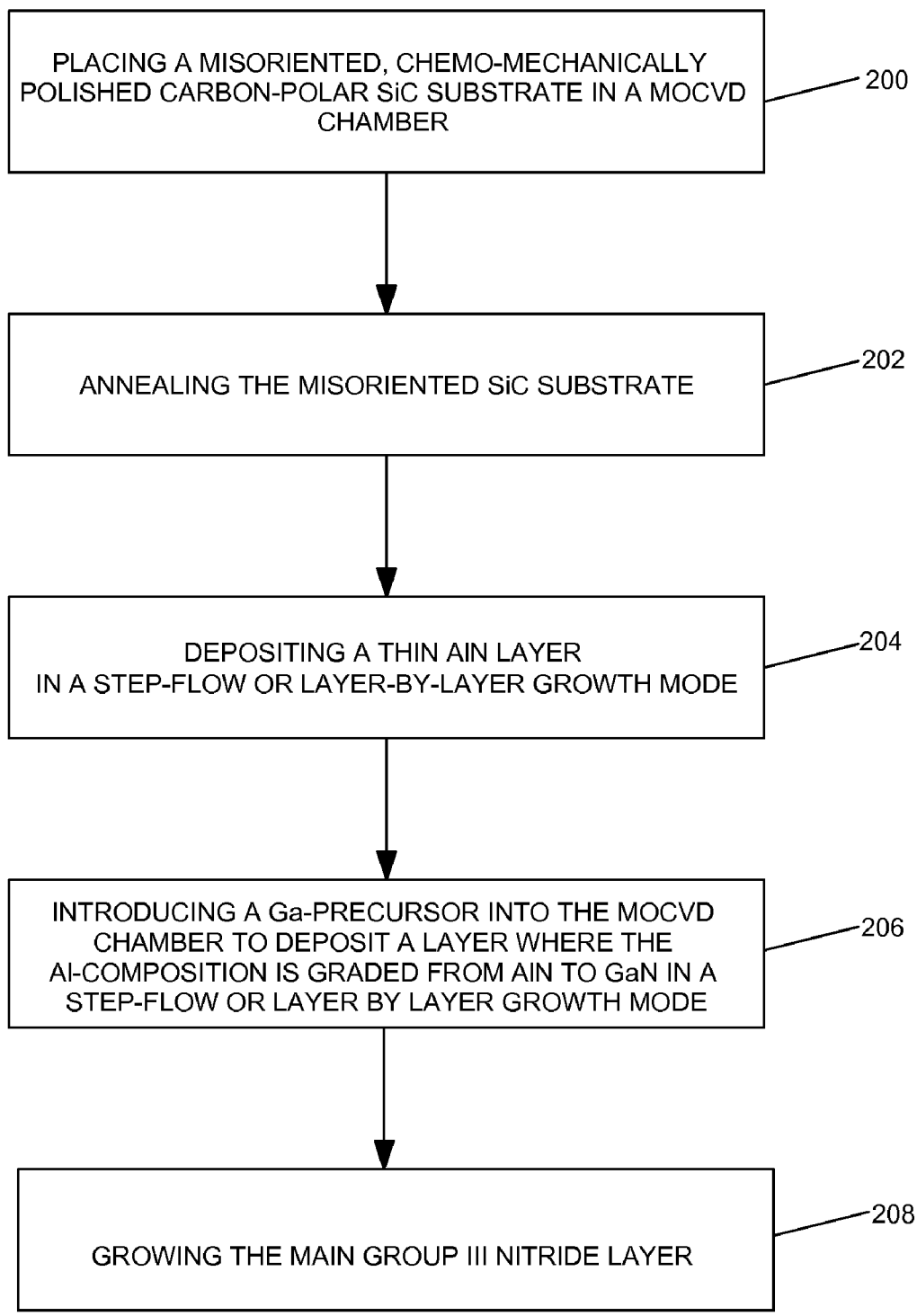
FIG. 2A illustrates a process chart in accordance with the present invention, for the growth on silicon carbide.

FIG. 2A illustrates a process chart in accordance with the present invention.

Block 200 represents the step of placing a misoriented, chemo-mechanically polished C-polar SiC substrate in a MOCVD chamber.

Block 202 represents the step of annealing the misoriented SiC substrate.

Block 204 represents the step of depositing, on the annealed misoriented substrate, a thin AlN layer in a step-flow or layer-by-layer growth mode.

Block 206 represents the optional step of introducing an additional Ga-precursor into the MOCVD chamber to deposit, on the AlN, a layer where the Al-composition is graded or stepped from AlN to GaN in a step-flow or layer by layer growth mode.

Block 208 represents the step of growing the main group III nitride layer on the graded layer.

Growth on Si

For growth on Si (111), this invention is realized by:

Placing a misoriented, polished (e.g. chemo-mechanically polished) Si (111) substrate in the MOCVD reactor and annealing at around 1090° C. surface temperature in a $H_2$ environment.

The substrate is then nitridized in $NH_3$ and $H_2$ for several seconds at approximately 980° C. surface temperature, leading to the formation of a thin silicon nitride surface layer on the sapphire which sets the N-face polarity of the growth.

$NH_3$ and Trimethylaluminum (TMA) are then flowed into the reactor to commence growth of a thin AlN layer in a step-flow-growth-mode or layer-by-layer growth mode. To increase the surface mobility of Al-species, a surfactant, for example indium, in form of trimethylindium (TMI), can be additionally flowed into the reactor [5].

Trimethylgallium (TMG) is then also flowed into the reactor to commence the growth of a graded or stepped $Al_xGa_{1-x}N$ layer, the composition of which is graded or stepped from AlN to GaN. The injection of TMI can be continued. (step optional)

$NH_3$ and Trimethylgallium are then flowed into the reactor to commence growth of the main GaN layer.

Currently, the growth method being used is MOCVD; however this invention could become quite useful for other growth methods such as MBE, HVPE, CBE, etc.

The process described applies very generally to GaN growth however, the invention can be easily utilized to create InN (with the use of TMI instead of TMG), AlN (with the use of TMA instead of TMG), or any of their alloys, also with other group-V atoms (Al, Ga, In)(N, P, As), by combining the appropriate precursors. Other precursors can be used such as triethylgallium, triethylaluminum for group-III sources, and dimethylhydrazine for N sources. Any appropriate substrate can be used, such as SiC, Si, spinel, etc. The nitridation temperature and time can be varied. Other growth initiation procedures can be applied. For example, the growth can be initiated with the deposition of an AlGaN layer etc., or no growth initiation step might be required at all. Note that, while part (b) specifies the deposition of a thin AlN layer, any thickness of the AlN layer may be used, and nitride materials other than AlN may be used. The annealing step of the substrate can be eliminated. The graded or stepped AlGaN layer can be eliminated and be replaced by any (Al,Ga,In)N layer of any composition if grown in a step-flow-growth-mode or layer-by-layer-growth-mode. The substrate can be misoriented not only towards the Si <−110> or Si <11-2> directions but also in any other direction. Misoriented Si (001) instead of Si(111) can be used as substrate. Instead of a single composition layer, the composition of the layer/crystal can be modified for all individual growth steps. The growth of each individual layer may also be interrupted for the deposition of layers comprised of other materials, for example silicon nitride or silicon oxide, possibly for strain or dislocation management.

Figure 2B:
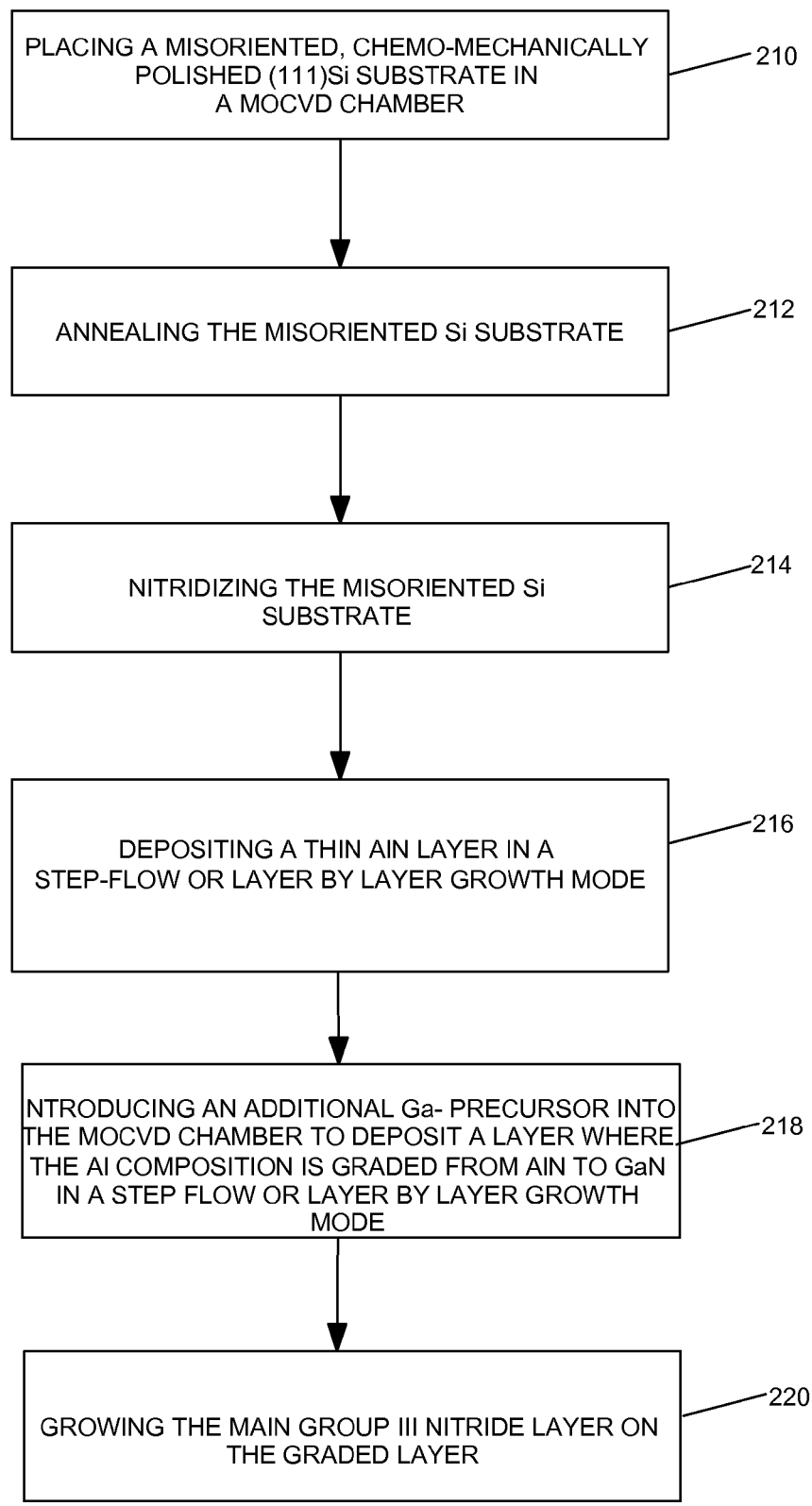
FIG. 2B illustrates a process chart in accordance with the present invention, for the growth on silicon.

FIG. 2B illustrates a process chart in accordance with the present invention.

Block 210 represents the step of placing a misoriented, chemo-mechanically polished (111) Si substrate in a MOCVD chamber.

Block 212 represents the step of annealing the misoriented Si substrate.

Block 214 represents the step of nitridizing the misoriented Si substrate.

Block 216 represents the step of depositing, on the nitridized misoriented substrate, a thin AlN layer in a step-flow or layer-by-layer growth mode.

Block 218 represents the optional step of introducing an additional Ga-precursor into the MOCVD chamber to deposit, on the AlN, a layer where the Al-composition is graded or stepped from AlN to GaN in a step-flow or layer by layer growth mode.

Block 220 represents the step of growing the main group III nitride layer on the graded layer.

Growth of Semi-Insulating Group-III Nitride Layers

Figure 3:
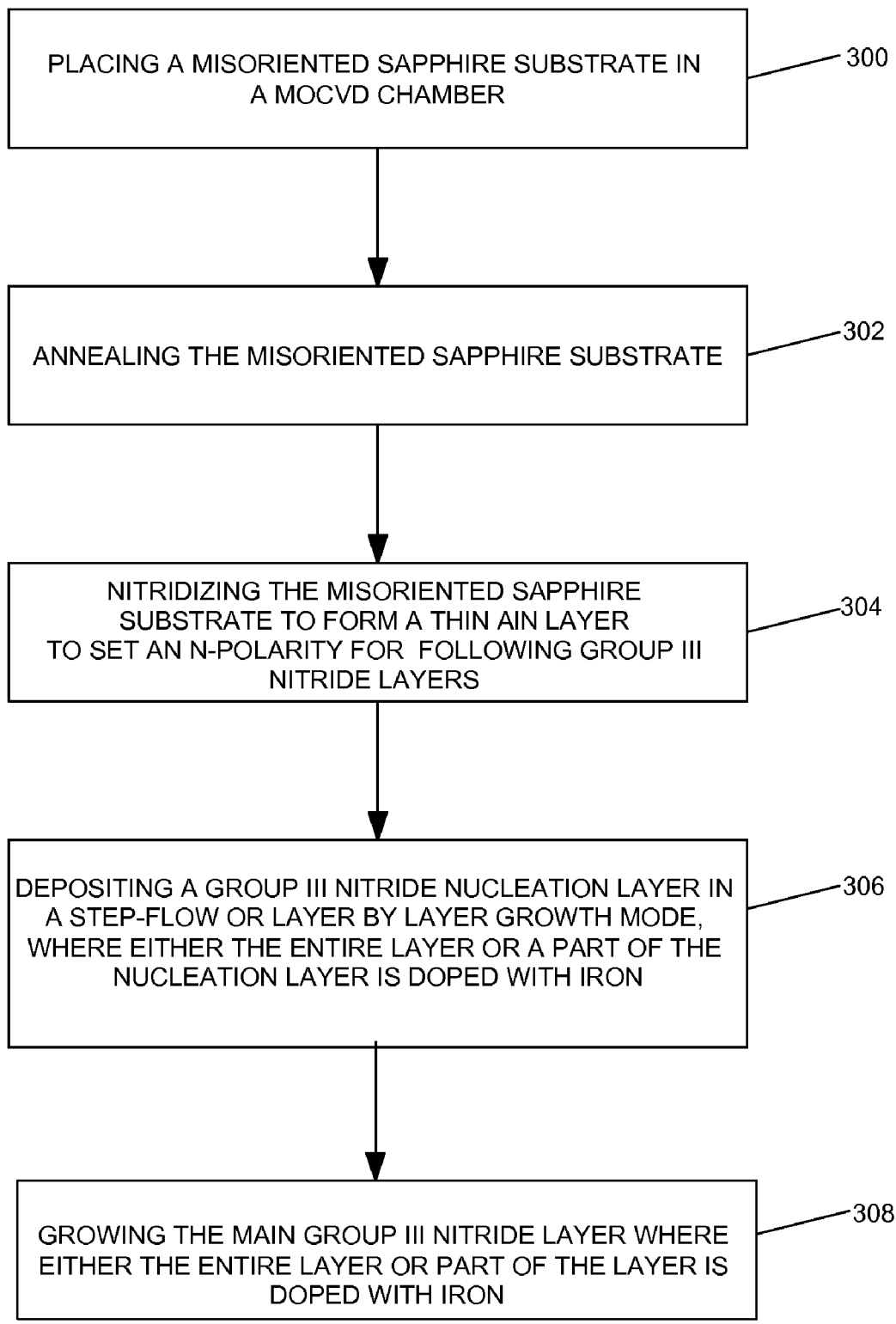
FIG. 3 illustrates a process chart in accordance with the present invention, for the growth of semi-insulating GaN on sapphire.

For the growth of semi-insulating group-III nitride base layers a dopant with acceptor character, for example iron, possibly using the precursor bis-cyclopentadienyl-iron $(Cp)_2$ Fe, is added during the growth of the layers or part of the layer growth, as seen in the process charts of FIGS. 3 and 4.

Devices utilizing lateral conduction, such as transistors, fabricated from group-III nitride heterostructures grown using this invention shall be aligned in such a way that the lateral carrier conduction occurs parallel to surface steps/undulations of the group-III nitride crystal. For example for layer structures deposited on sapphire with a misorientation direction of <11-20>, or on C-polar SiC substrates with a misorientation direction of <1-100>, both leading to group-III nitride surface steps/undulations parallel to the <11-20> direction of the GaN crystal, source and drain contacts of transistors need to be aligned in such a way that the transistor channel is aligned parallel to the <11-20> direction of the GaN crystal.

FIG. 3 illustrates a process chart in accordance with the present invention for the growth of semi-insulating GaN on sapphire.

Block 300 represents the step of placing a misoriented sapphire substrate in a MOCVD chamber.

Block 302 represents the step of annealing the misoriented sapphire substrate.

Block 304 represents the step of nitridizing the annealed misoriented sapphire substrate to form a thin (AlN surface layer) to set an N-polarity for following group-III nitride layers.

Block 306 represents the step of depositing, on the AlN, a group-III nitride nucleation layer in a step-flow or layer-by-layer growth mode, where either the entire layer or a part of the nucleation layer is doped with iron.

Block 308 represents the step of growing, on the AlN layer, the main group-III nitride layer, where either the entire layer or a part of the layer is doped with iron (the second group-III nitride layer having an N-face).

Figure 4A:
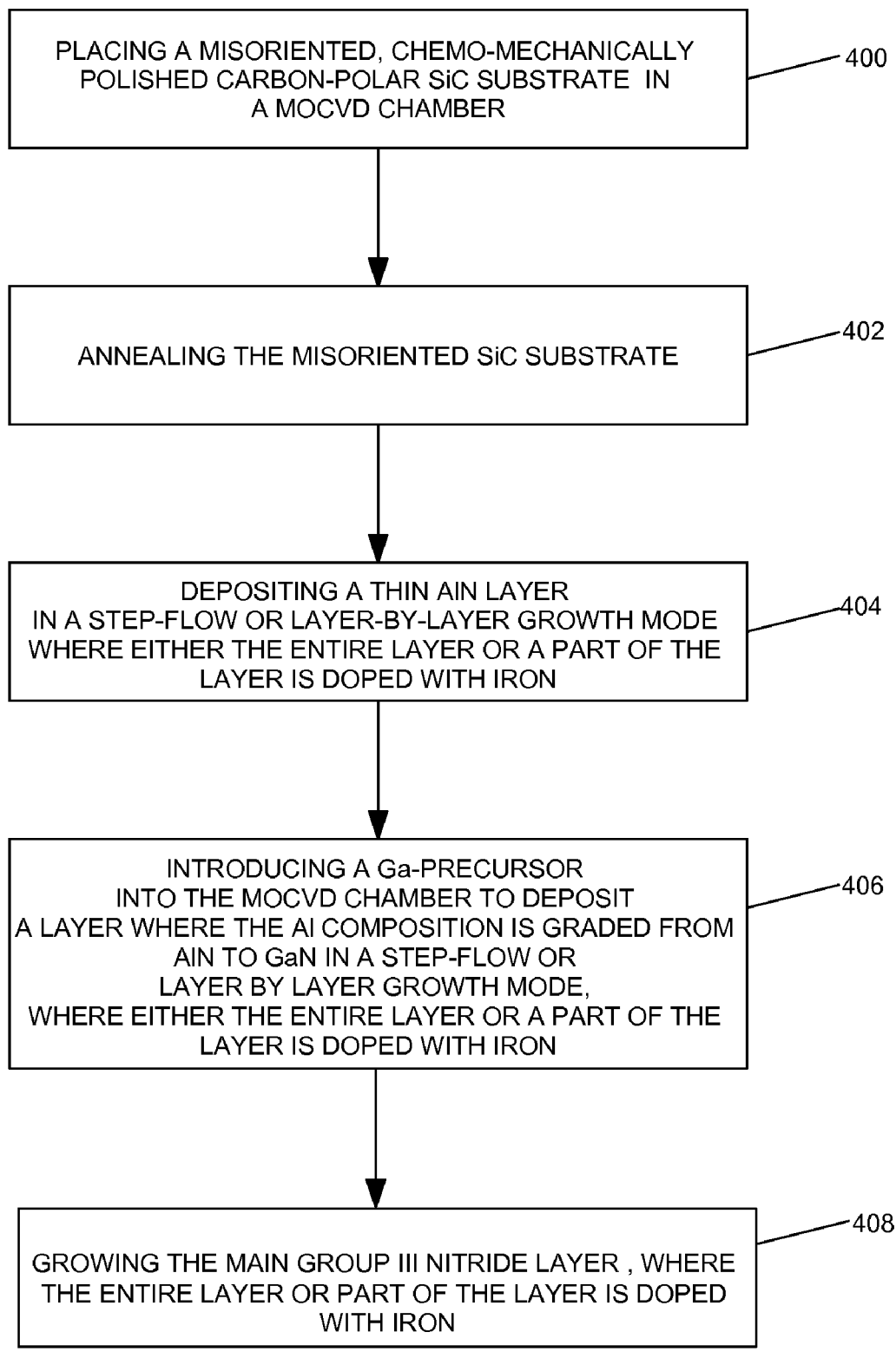
FIG. 4A illustrates a process chart in accordance with the present invention, for the growth of semi-insulating GaN on silicon carbide substrate.

FIG. 4A illustrates a process chart in accordance with the present invention for the growth of semi-insulating GaN on a SiC substrate.

Block 400 represents the step of placing a misoriented, chemo-mechanically polished C-polar SiC substrate in a MOCVD chamber.

Block 402 represents the step of annealing the misoriented SiC substrate.

Block 404 represents the step of depositing, on the annealed substrate, a thin AlN layer in a step-flow or layer-by-layer growth mode where either the entire layer or a part of the layer is doped with iron.

Block 406 represents the optional step of introducing an additional Ga-precursor into the MOCVD chamber to deposit, on the AlN, a layer where the Al-composition is graded or stepped from AlN to GaN in a step-flow or layer by layer growth mode, where either the entire layer or a part of the layer is doped with iron.

Block 408 represents the step of growing, on the graded layer, the main group-III nitride layer where the entire layer or part of the layer are doped with iron (the group-III nitride layer having an N-face).

Figure 4B:
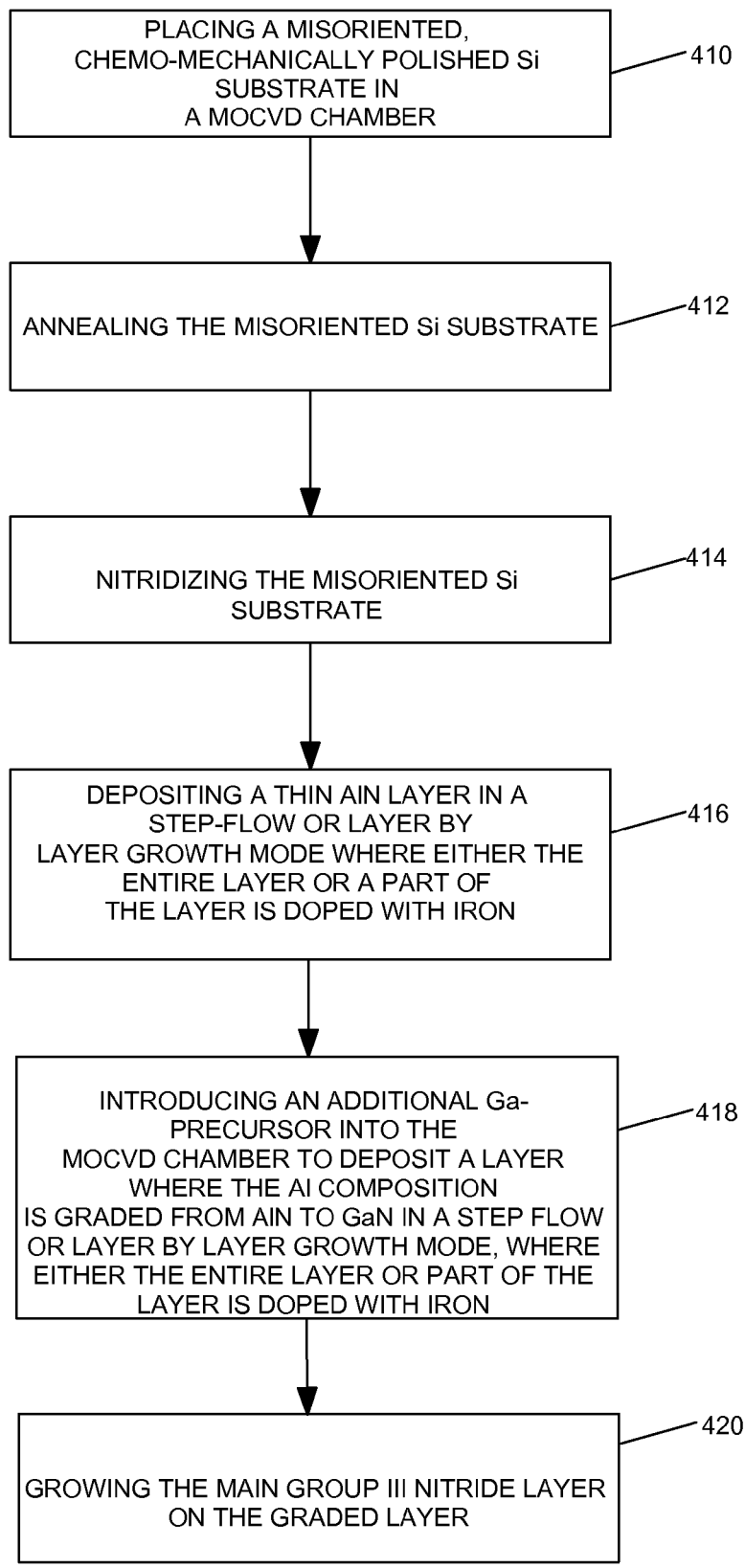
FIG. 4B illustrates a process chart in accordance with the present invention, for the growth of semi-insulating GaN on a silicon (111) substrate.

FIG. 4B illustrates a process chart in accordance with the present invention for the growth a Si (111) substrate.

Block 410 represents the step of placing a misoriented, chemo-mechanically polished Si substrate in a MOCVD chamber.

Block 412 represents the step of annealing the misoriented Si substrate.

Block 414 represents the step of nitridizing the misoriented Si substrate.

Block 416 represents the step of depositing, on the annealed substrate, a thin AlN layer in a step-flow or layer-by-layer growth mode where either the entire layer or a part of the layer is doped with iron.

Block 418 represents the optional step of introducing an additional Ga-precursor into the MOCVD chamber to deposit, on the AlN, a layer where the Al-composition is graded or stepped from AlN to GaN in a step-flow or layer by layer growth mode, where either the entire layer or a part of the layer is doped with iron.

Block 420 represents the step of growing, on the graded layer, the main group-III nitride layer where the entire layer or part of the layer are doped with iron (the first Fgroup-III nitride layer having an N-face).

While the present invention, in FIGS. 3 to 4 for example, describes the growth of main group III-nitride layer(s), any nitride layers having an N-face may be grown, for example group III-V layers or group III-nitride layers having an N-face, as discussed throughout the specification.

Fe dopants can be replaced by other dopants with acceptor character, for example Mg, Zn or C.

The heteroepitaxially N-polar group-III nitride films grown according to the present invention serve as base layers for following group-III nitride layer sequences according to the specific device application.

FIG. 5(a) shows an optical microscope image of an N-face GaN film grown by MOCVD on a nitridized sapphire substrate. FIG. 5(b) shows an atomic force microscope (AFM) image of N-face GaN grown by MOCVD on a nitridized sapphire substrate, wherein the root mean square (RMS) roughness is 0.9 nm.

Figure 6:
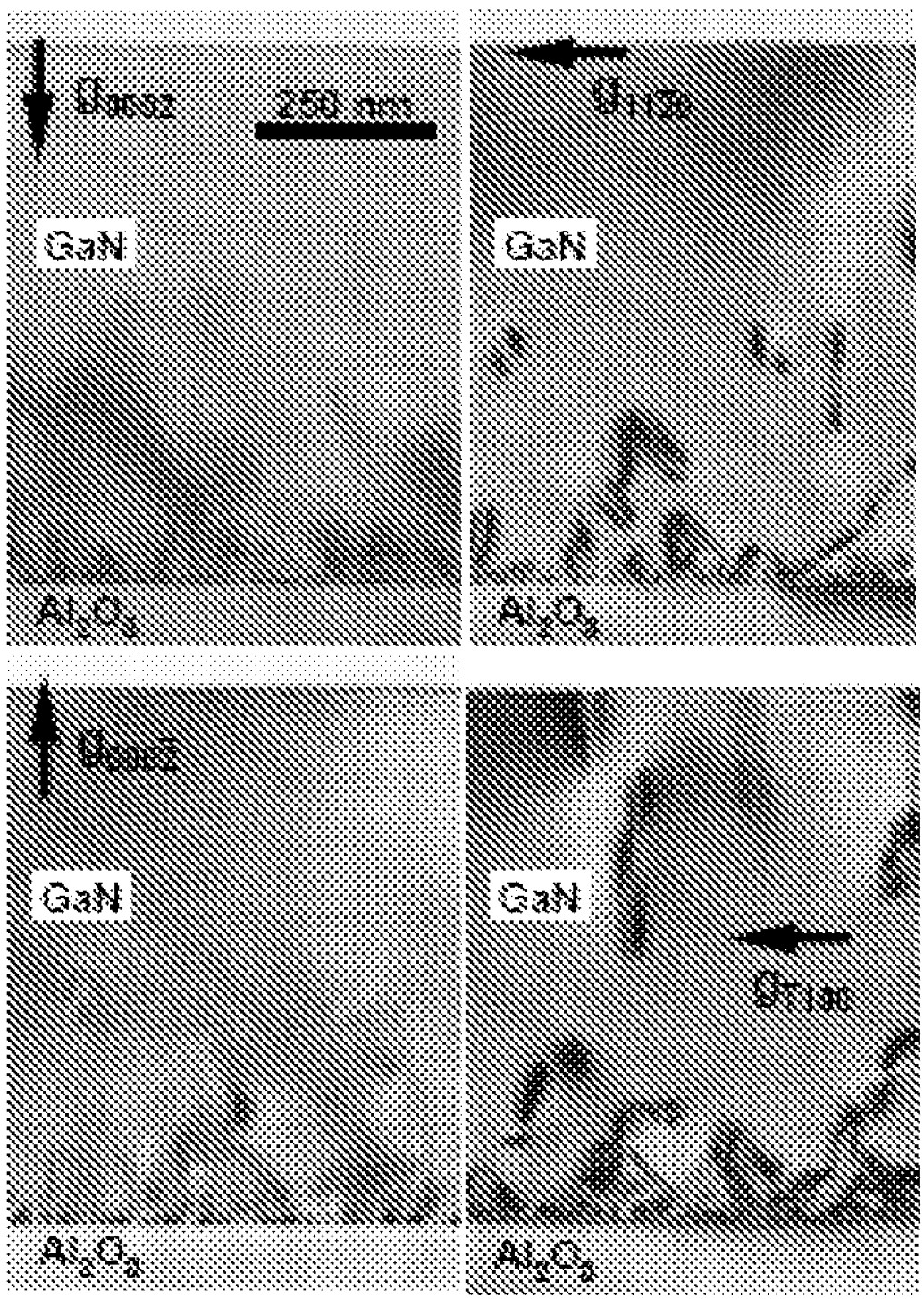
FIG. 6 shows transmission electron micrographs, under different imaging conditions, of an N-face GaN film grown using the present invention FIG. 7($a$) shows an AFM image of InGaN/GaN multi quantum wells (MQWs) grown using the present invention, and FIG. 7($b$) shows photoluminescence (PL) from MQWs comprising 5×(3 nm thick $In_{0.8}Ga_{0.9}N$/8 nm thick GaN).

FIG. 6 shows transmission electron micrographs, under different imaging conditions, of an N-face GaN film grown using the present invention. The estimated threading dislocation density is at most of the order $10^9$ cm$^{-2}$.

FIG. 7(a) shows an AFM image of InGaN/GaN multi quantum wells (MQWs) grown using the present invention, where the RMS roughness is 0.85 nm, showing a smooth surface at InGaN growth temperatures. FIG. 7(b) shows 300 Kelvin photoluminescence (PL) of MQWs comprising 5×(3 nm thick $In_{0.1}Ga_{0.9}N$/8 nm thick GaN), grown by MOCVD according to the present invention.

Figure 8:
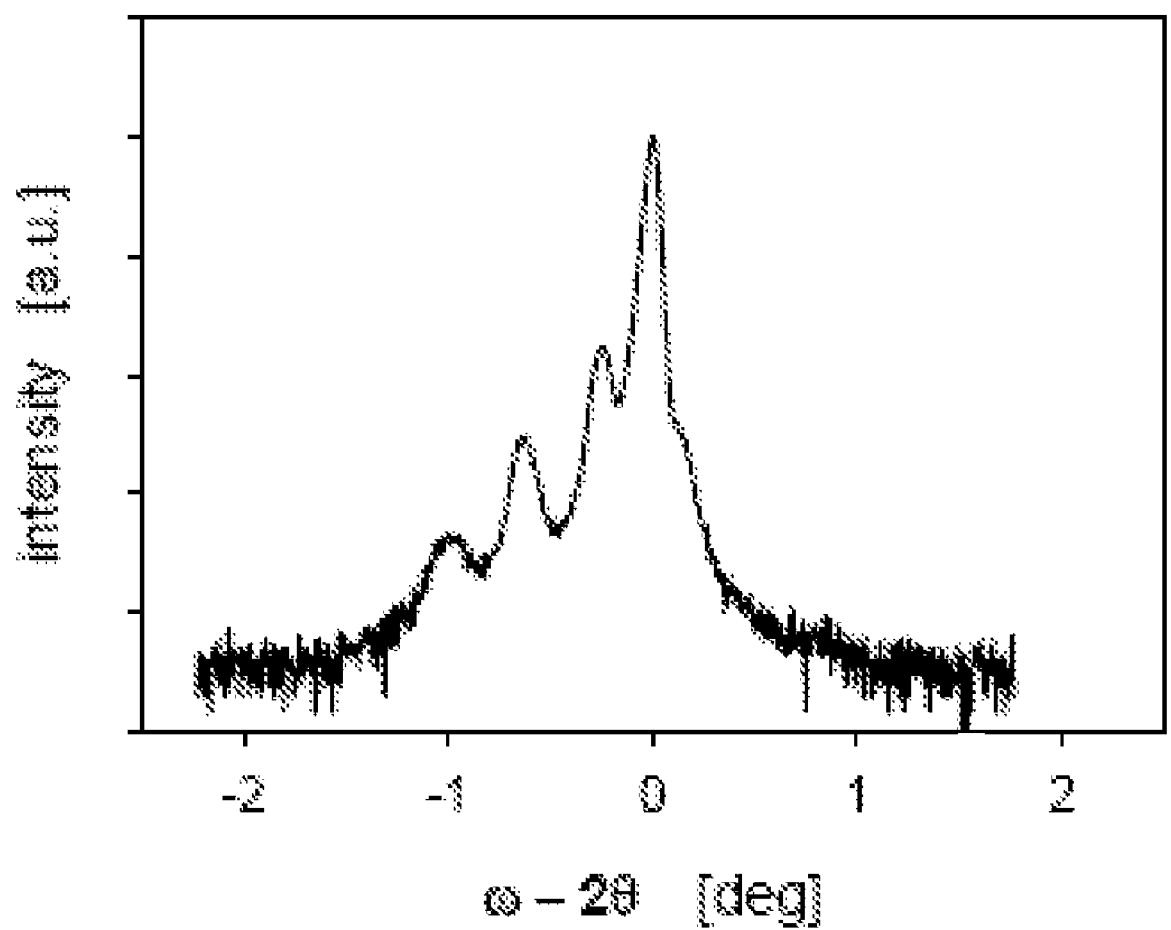
FIG. 8 shows X-ray Diffraction (XRD) of N-face nitride MQWs comprising 5×(4 nm thick $In_{0.12}Ga_{0.88}N$/10 nm thick GaN).

FIG. 8 shows X-ray Diffraction (XRD) of N-face nitride MQWs comprising 5×(4 nm thick $In_{0.12}Ga_{0.88}N$/10 nm thick GaN), which is comparable to Ga-face XRD results.

Growth of P-Type N-Polar Group-III Nitrides

Similar to Ga-polar group-III nitrides, p-type doping can be executed using bis-cyclopentadienyl magnesium or one of its derivates as precursor. In N-polar nitride films, however, higher Mg doping levels can be realized without degradation of the crystal quality and the surface morphology. In addition, sharper Mg-doping profiles can be realized, realizing great advantages for a variety of p-n junction devices.

Stabilization of the Surface

To stabilize the surface of any N-polar group-III nitride film, a thin insulator layer, for example silicon nitride or silicon oxide, can be deposited on top of the nitride film, possibly in-situ. The surface can also be stabilized through the deposition of a thin p-type N-polar nitride film, which can be fabricated through doping with Mg using the precursor bis-cyclopentadieny-magnesium, for example.

Growth of Group-III Nitrides with Surface Planes Comprised of a High Fraction of N Atoms The use of misoriented substrates is beneficial also for the growth of group-III nitride films with surfaces which are comprised of a high fraction of N atoms other than the (000-1) surface, for example semi-polar N-face films.

Impurity Incorporation in Heteroepitaxial N-face and Ga-face GaN Grown by MOCVD.

In group III-nitrides, the crystal growth orientation has a substantial impact upon the chemical and physical properties of the material. Among these properties is the impurity incorporation, which has been studied on Ga-face (0001) GaN, but has not been extensively explored for N-face (000-1) GaN. Presumably, the discrepancy in the understanding between the two polarities arises from the historically rough hexagonal surface morphology of N-face GaN when grown by MOCVD. However, the present invention has shown that through the use of vicinal sapphire substrates, smooth N-face GaN can be grown heteroepitaxially by MOCVD. As such, surface roughnesses and threading dislocations grown on misoriented substrates, as shown in the present invention, are comparable to Ga-face GaN films.

The present invention has also studied the difference in impurity incorporation between MOCVD grown N-face GaN on different sapphire off-cuts, and Ga-face GaN, using secondary ion mass spectroscopy (SIMS). The unintentional impurities oxygen, carbon, and hydrogen, as well as the intentional impurities silicon and magnesium, were studied as a function of changes in the temperature, pressure, V/III ratio and Ga flow.

Ga-face and N-face GaN templates, approximately 1 μm thick, were first grown separately, due to the need for different growth initiation conditions. For the N-face, templates were grown on off-cuts of 2°, 4°, 5° towards the sapphire [10-10] direction as well as 4° and 5° towards the sapphire [11-20] direction. A piece of the Ga-face and each of the N-face templates were then co-loaded in the MOCVD reactor, where a "SIMS stack" was regrown which allowed a direct comparison between each of the off-cuts and polarities. The first SIMS stack explored variations in Ga flow and pressure, while the second contained variations in temperature and V/III ratio.

Figure 9:
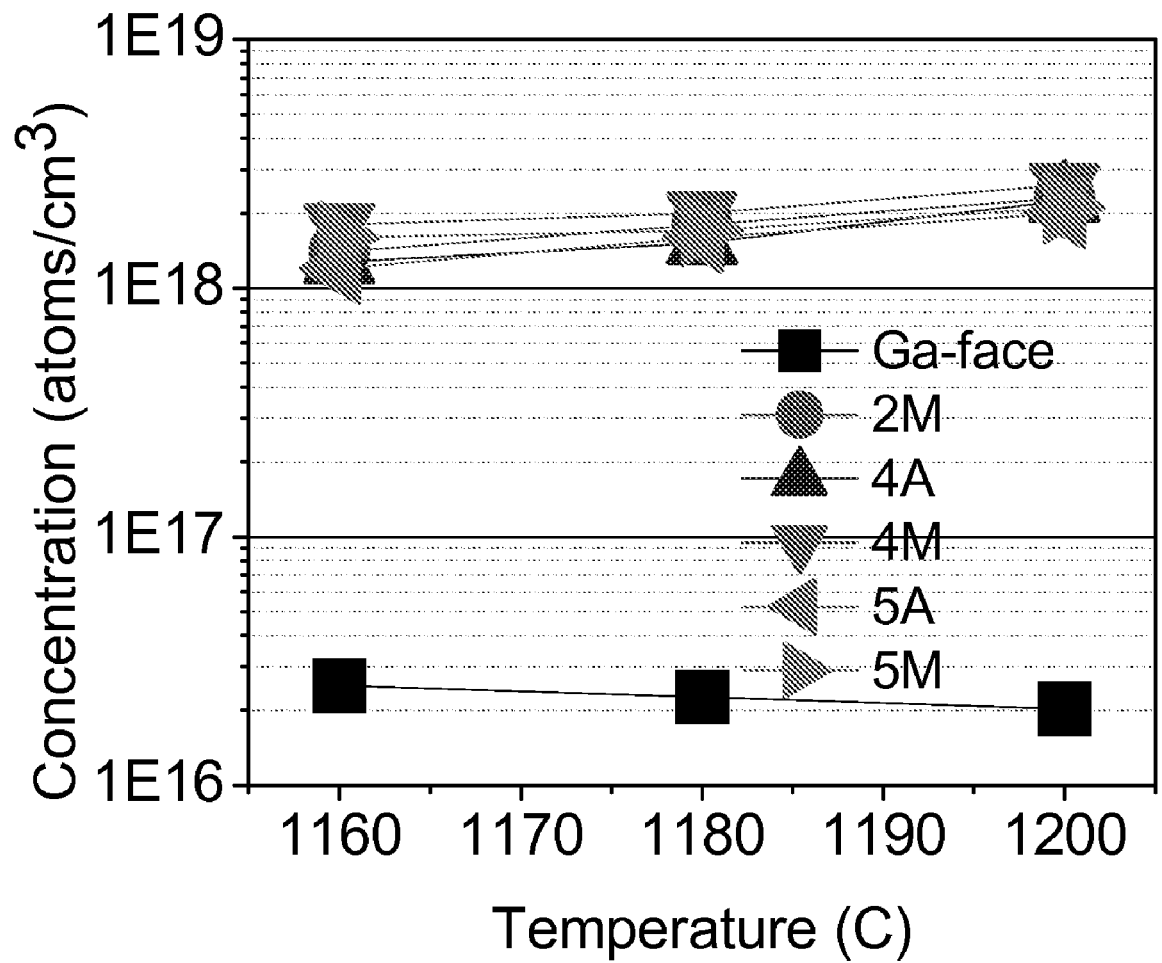
FIG. 9 is a graph showing SIMS results of oxygen impurities as a function of temperature.
Figure 10:
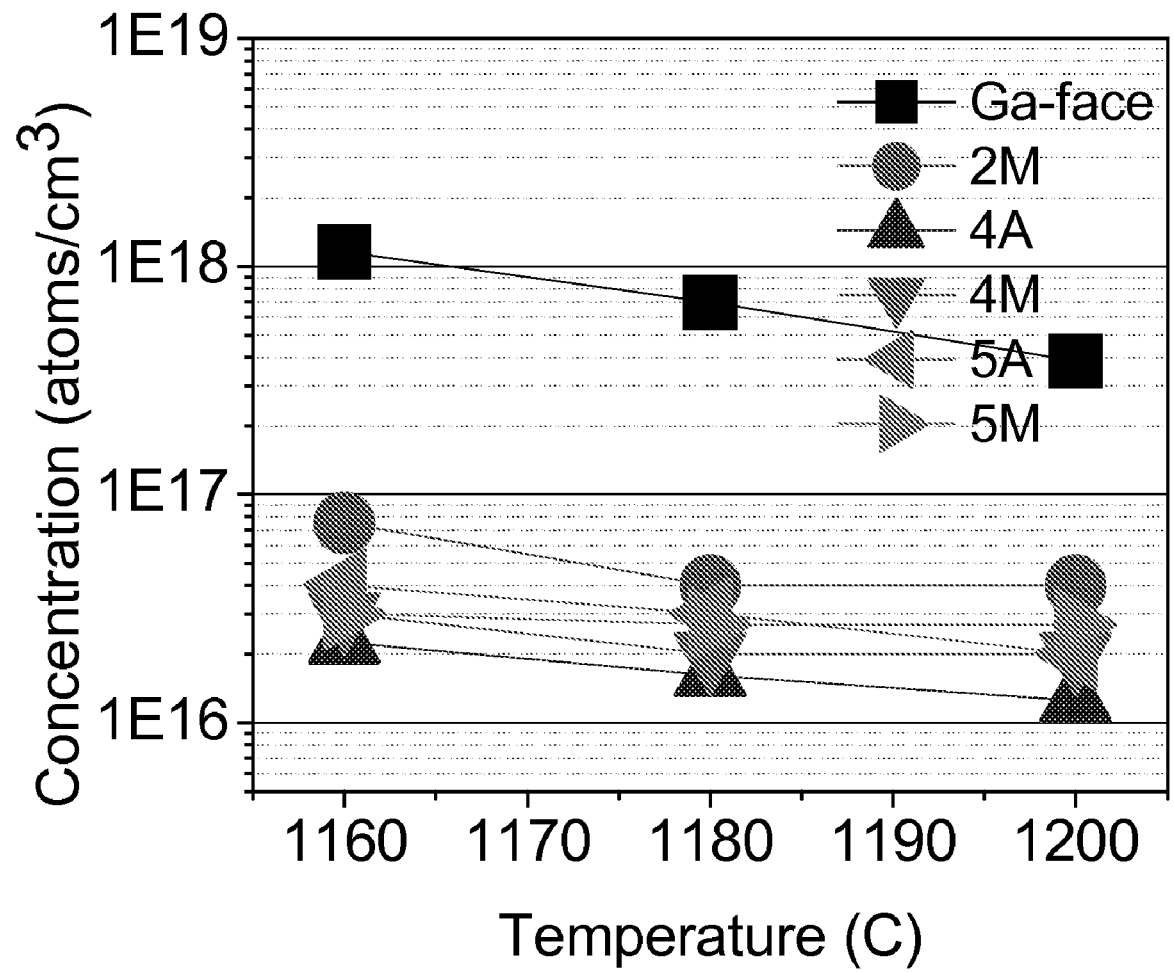
FIG. 10 is a graph showing SIMS results of carbon impurities as a function of temperature.

The SIMS results for oxygen incorporation as a function of temperature, shown in FIG. 9, indicated that oxygen incorporation on all of the N-face off-cuts was substantially higher than the Ga-face. However, the carbon incorporation as a function of temperature, shown in FIG. 10, was substantially higher on the Ga-face when compared to all of the N-face off-cuts. Models based upon the difference in atomic bonding on N-/Ga-face surfaces will be presented elsewhere. Additionally, the impact of changes in the growth conditions for oxygen and carbon incorporation will be discussed elsewhere. Hydrogen incorporation was comparable between both polarities. The present invention found that Mg and Si incorporation was also comparable on all samples.

However, the present invention found a significant difference in the Mg incorporation profiles, between N- and Ga-face samples, as shown in FIG. 11. These results present a direct comparison between the impurity incorporation of Ga- and N-face GaN films, and indicate that impurity incorporation on smooth N-face can be controlled through growth conditions for use in device applications. P-type (e.g. Mg) doping N-face nitride films leads to the creation of abrupt p-type doping profiles, as evidenced by the profile 1100 in FIG. 11(a), as compared to the less well defined p-type doping profiles 1102 produced when p-type doping Ga-face nitride films. Thus, the present invention provides a method for the creating a group III-nitride film with an abrupt p-type doping profile, comprising growing and doping a group III-nitride film with an N-face.

Advantages and Improvements

Currently most N-polar GaN films grown by MOCVD, which is the most commonly used growth method for large scale fabrication of GaN based devices, are characterized by large (μm sized) hexagonal features which make the material unacceptable for device applications. This invention allows for the growth of smooth, high quality films which makes the development of N-face devices possible.

For HEMTs, device structures which were not feasible with the traditional Ga-face will now be available with smooth N-face growth.

One of the major challenges to III-Nitride based light emitters is the growth of high quality InGaN. N-face allows the growth of InGaN at higher temperatures than the traditional Ga-face, which provides better quality material as well as making higher indium content films feasible [6].

Another challenge to the growth of light emitters is p-type doping. In the traditional Ga-face material, too high p-type doping (Mg) causes the surface to locally invert to N-face causing a poor quality film. Since the growth is now performed on the N-face the film quality can be maintained at higher levels of p-type doping which will lead to a much better device performance. In addition sharper Mg-doping profiles can be realized further improving the device performance.

III-Nitride based light emitters suffer from strong polarization induced electric fields. N-face material provides an electric field in the opposite direction to the traditional Ga-face which should allow, for instance, for lower operating voltages and improved carrier injection resulting in an increased efficiency in light emitting devices.

The etching properties of N-face are distinctly different from that of Ga-face which will be useful in creating better light extraction schemes in LEDs, such as surface roughening, and mega-cones, as well as etched facets for LDs.

The Mg memory effect, present on Ga-face, is not significant on the N-face, which allows for the creation of abrupt p-type doping profiles, not available on the Ga-face, for use in device structures.

N-polar devices grown on misoriented substrates make use of enhanced charge (e.g electron and/or hole) transport properties in a specific direction related to the misorientation direction through appropriate alignment of the device channel with respect to the misorientation direction. So, for example, and not by way of limitation, the channel of a transistor or charge transport channel of any device can be created such that the orientation of the channel and the enhanced charge transport properties are both used to create the desired charge transport for a given device. Some devices may desire faster charge transport, and, as such, the channel would be aligned perpendicular to the misorientation direction of the N-face (Al,Ga,In)N layer(s) to increase charge transport in such devices; other devices may require a resistance or other slowing of the charge transport, and the channel can be aligned parallel or at some other alignment other than parallel to the enhanced charge transport of the misoriented N-face film grown on the misoriented substrate. Such design characteristics can now be taken into account when designing the device which were previously unavailable to the device designer.

FIGS. 12a-12f illustrate optical micrographs of 0.8 micron thick GaN films grown on sapphire substrates in accordance with the present invention.

FIG. 12a shows growth in a misorientation of 0.5 degrees towards the a-plane, and FIG. 12b shows growth in a misorientation of 0.5 degrees toward the m-plane.

FIG. 12c shows growth in a misorientation of 1 degree towards the a-plane, and FIG. 12d shows growth in a misorientation of 1 degree toward the m-plane.

FIG. 12e shows growth in a misorientation of 2 degrees towards the a-plane, and FIG. 12f shows growth in a misorientation of 2 degrees toward the m-plane.

The inserts in FIGS. 12a and 12b are enlarged 3 times from that of the main figures.

REFERENCES

The following references are incorporated by reference herein:

[1] Homo-epitaxial GaN growth on exact and misoriented single crystals: suppression of hillock formation: A. R. A. Zauner, J. L. Weyher, M. Plomp, V. Kirilyuk, I. Grzegory, W. J. P. van Enckevort, J. J. Schermer, P. R. Hageman, and P. K. Larsen, J. Cryst. Growth 210 (2000) 435-443.

[2] Homo-epitaxial GaN growth on the N-face of GaN single crystals: the influence of the misorientation on the surface morphology: A. R. A. Zauner, A. Aret, W. J. P. van Enckevort, J. L. Weyher, S. Porowski, J. J. Schermer, J. Cryst. Growth 240 (2002) 14-21.

[3] A. P. Grzegorczyk et al. Influence of sapphire annealing in trimethylgallium atmosphere on GaN epitaxy by MOCVD: J. Cryst. Growth 283 (2005) 72-80.

[4] N-polarity GaN on sapphire substrates grown by MOCVD: T. Matsuoka, Y. Kobayashi, H. Takahata, T. Mitate, S Mizuno, A. Sasaki, M. Yoshimoto, T. Ohnishi, and M. Sumiya, Phys. Stat. Sol. (b) 243 (2006) 1446-1450.

[5] Indium-surfactant-assisted growth of high-mobility AlN/GaN multilayer structures by MOCVD, S. Keller, S. Heikman, I. Ben-Yaakov, L. Shen, S. P. DenBaars, and U. K. Mishra, Appl. Phys. Lett. 79 (2001) 3449.

[6] The effect of substrate polarity on the growth of InN by RF-MBE: Naoi et al., J. Cryst. Growth 269 (2004) 155-161.

[7] Nitridation of sapphire. Effect on the optical properties of GaN epitaxial overlayers: N. Grandjean, J. Massies, and M. Leroux, Appl. Phys. Lett. 69 (1996) 2071.

[8] Energetics of AlN thin films on the $Al_2O_3$ (0001) surface: R. Di Felice and J. Northrup, Appl. Phys. Lett. 73 (1998) 936.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims appended hereto.

What is claimed is:

1. A method for growing an N-face group III nitride film, comprising:
   (a) providing a substrate having a growth surface with a misorientation angle between 0.5 and 10 degrees relative to a miller indexed crystallographic plane [h, i, k, l] of the substrate, where h, i, k, l are miller indices;
   (b) forming an AlN layer on the growth surface;
   (c) growing the N-face group III-nitride film on the AlN layer, wherein the N-face group III-nitride film is smoother than an N-face group III-nitride film grown on a substrate without a misorientation angle.

2. The method of claim 1, wherein the miller indices are h=1, i=0, k=0 and l=−1 and the substrate is silicon carbide.

3. The method of claim 1, wherein the miller indices are h=0, i=0, k=0 and l=1 and the substrate is sapphire.

4. The method of claim 1, wherein the miller indices are h=1, k=1, l=1 and the substrate is silicon.

5. The method of claim 1, wherein the substrate is (001) Si.

6. The method of claim 1, wherein the growing is by Metal Organic Chemical Vapor Deposition (MOCVD).

7. The method of claim 1, wherein the N-face group III-nitride film is grown on a nitridized misoriented substrate.

8. The method of claim 1, wherein a (Al, Ga,In)N nucleation layer is deposited onto the AlN layer using a step flow growth mode.

9. The method of claim 1, wherein the AlN layer sets an N-polarity for subsequently deposited group III-nitride layers.

10. The method of claim 7, wherein the misoriented substrate is a sapphire substrate.

11. The method of claim 10, further comprising depositing a group III-nitride nucleation layer on an AlN layer formed on the sapphire substrate due to the nitridization, and growing the N-face group III-nitride film on the group III-nitride nucleation layer.

12. The method of claim 11, wherein the group III-nitride nucleation layer is deposited using a step flow growth mode.

13. The method of claim 11, wherein the group III-nitride nucleation layer is at least partially doped.

14. The method of claim 13, wherein the growing of the N-face group lll-nitride film comprises:
   (a) doping and growing, on the nucleation layer, a first N-face group III nitride layer, and
   (b) growing a second N-face group III-nitride layer on the first N-face group-III layer so that at least part of the second N-face group III-nitride layer is doped.

15. The method of claim 1, wherein the misoriented substrate is a polished Carbon Polar Silicon Carbide substrate.

16. The method of claim 15, further comprising depositing a group III-nitride layer having a changing composition on the AlN layer, wherein an Al composition of the group III-nitride layer having the changing composition is graded from AlN to GaN.

17. The method of claim 16, wherein the graded group III-nitride layer is at least partially doped.

18. The method of claim 17, wherein the growing of the group III-nitride layer having an N-face comprises:
   (a) doping and growing, on the graded group III-nitride layer, a first group III-nitride layer having an N-face and
   (b) growing a second group III-nitride layer having an N-face, so that at least part of the second group III-nitride layer having an N-face is doped.

19. A method for creating a group III-nitride film with an abrupt p-type doping profile, comprising
   (a) providing a substrate having a growth surface with a misorientation angle between 0.5 and 10 degrees relative to a miller indexed crystallographic plane [h, i, k, l] of the substrate, where h, i, k, l are miller indices;

(b) forming an AlN layer on the growth surface: and (c) growing the N-face group III-nitride film having an abrupt p-type doping profile on the AlN layer, wherein the group III-nitride film having an N-face is smoother than an N-face group III-nitride film grown on a substrate without a misorientation angle.

20. A method for enhancing charge transport properties of a nitride device, comprising:

fabricating the nitride device using N-face nitride layers grown on a substrate having a growth surface with a misorientation angle between 0.5 and 10 degrees relative to a miller indexed crystallographic plane [h, i, k, l] of the substrate, where h, i, k, l are miller indices;

forming an AlN layer on the growth surface; and aligning a channel of the nitride device substantially perpendicular to a misorientation direction of the misoriented N-face (Al,Ga,In)N layer grown on a misoriented substrate, wherein charge transport properties are enhanced in the misorientation direction.

* * * * *